United States Patent
Aihara et al.

(10) Patent No.: US 8,754,398 B2
(45) Date of Patent: Jun. 17, 2014

(54) LIGHT-EMITTING DIODE, LIGHT-EMITTING DIODE LAMP AND LIGHTING DEVICE

(75) Inventors: Noriyuki Aihara, Chichibu (JP); Noriyoshi Seo, Hiki-gun (JP); Noritaka Muraki, Chichibu (JP)

(73) Assignee: Showa Denko K.K., Tokyo (JP)

( * ) Notice: Subject to any disclaimer, the term of this patent is extended or adjusted under 35 U.S.C. 154(b) by 16 days.

(21) Appl. No.: 13/574,894

(22) PCT Filed: Jan. 20, 2011

(86) PCT No.: PCT/JP2011/050966
§ 371 (c)(1),
(2), (4) Date: Jul. 24, 2012

(87) PCT Pub. No.: WO2011/090112
PCT Pub. Date: Jul. 28, 2011

(65) Prior Publication Data
US 2012/0305890 A1   Dec. 6, 2012

(30) Foreign Application Priority Data

Jan. 25, 2010   (JP) .................................. 2010-013531
Aug. 18, 2010   (JP) .................................. 2010-183206

(51) Int. Cl.
*H01L 29/06*   (2006.01)
*H01L 31/072*  (2012.01)
*H01L 31/109*  (2006.01)
*H01L 31/0328* (2006.01)
*H01L 31/0336* (2006.01)

(52) U.S. Cl.
USPC .................................. 257/13; 257/88; 438/26

(58) Field of Classification Search
USPC .................. 257/13, 88, 94, E33.008; 438/26
See application file for complete search history.

(56) References Cited

U.S. PATENT DOCUMENTS

2004/0104395 A1   6/2004   Hagimoto et al.
2005/0201439 A1*  9/2005   Horie .......................... 372/43.01
(Continued)

FOREIGN PATENT DOCUMENTS

JP   06-021507 A   1/1994
JP   07-038148 A   2/1995
(Continued)

OTHER PUBLICATIONS

International Search Report of PCT/JP2011/050966 dated Feb. 22, 2011.
(Continued)

*Primary Examiner* — Phuc Dang
(74) *Attorney, Agent, or Firm* — Sughrue Mion, PLLC

(57) ABSTRACT

A light-emitting diode, including a light emitting section including an active layer having a quantum well structure in which well layers having the composition: $(In_{X1}Ga_{1-X1})As$ ($0 \leq X1 \leq 1$) and barrier layers having the composition: $(Al_{X2}Ga_{1-X2})As$ ($0 \leq X2 \leq 1$) are alternately laminated, first guide and second guide layers paired to sandwich the active layer and having the composition: $(Al_{X3}Ga_{1-X3})As$ ($0 \leq X3 \leq 1$), and first cladding and second cladding layers paired to sandwich the active layer via the first guide layer and the second guide layer, respectively; a current diffusion layer formed on the light emitting section; and a functional substrate bonded to the current diffusion layer; wherein the first cladding layer and the second cladding layer have the composition: $(Al_{X4}Ga_{1-X4})_Y In_{1-Y}P$ ($0 \leq X4 \leq 1$, $0 < Y \leq 1$); and a light-emitting diode lamp and a lighting device using the same.

17 Claims, 9 Drawing Sheets

(56) References Cited

U.S. PATENT DOCUMENTS

| | | | |
|---|---|---|---|
| 2005/0207007 A1* | 9/2005 | Shimoda et al. | 359/449 |
| 2005/0242739 A1* | 11/2005 | Kawashima | 315/63 |
| 2006/0043392 A1 | 3/2006 | Kurahashi et al. | |
| 2008/0194080 A1* | 8/2008 | Cheng et al. | 438/463 |
| 2009/0180508 A1* | 7/2009 | Makita et al. | 372/45.01 |
| 2009/0206359 A1* | 8/2009 | Nabekura | 257/103 |
| 2009/0278148 A1* | 11/2009 | Nabekura et al. | 257/98 |

FOREIGN PATENT DOCUMENTS

| | | |
|---|---|---|
| JP | 2001-274454 A | 10/2001 |
| JP | 2002-026377 A | 1/2002 |
| JP | 2002-111048 A | 4/2002 |
| JP | 2002-344013 A | 11/2002 |
| JP | 2004-207508 A | 7/2004 |
| JP | 2006-066518 A | 3/2006 |
| JP | 2006-190792 A | 7/2006 |
| JP | 2007-194536 A | 8/2007 |
| JP | 2009-231756 A | 10/2009 |
| JP | 2010-016353 A | 1/2010 |
| TW | 200711178 A | 3/2007 |
| TW | 200742127 A | 11/2007 |
| TW | 201003999 A | 1/2010 |
| WO | 2008/151255 A1 | 12/2008 |

OTHER PUBLICATIONS

Office Action ("Notification for the Opinion of Examination") with a mailing date of Jun. 24, 2013 for corresponding Taiwanese Patent Application No. 100102476.

* cited by examiner

LIGHT-EMITTING DIODE, LIGHT-EMITTING DIODE LAMP AND LIGHTING DEVICE

CROSS REFERENCE TO RELATED APPLICATIONS

This application is a National Stage of International Application No. PCT/JP2011/050966 filed Jan. 20, 2011, claiming priority based on Japanese Patent Application Nos. 2010-013531 filed Jan. 25, 2010 and JP 2010-183206 filed Aug. 18, 2010, the contents of all of which are incorporated herein by reference in their entirety.

TECHNICAL FIELD

The present invention relates to a light-emitting diode having an emission peak wavelength of 850 nm or more, particularly 900 nm or more, and a light-emitting diode lamp and a lighting device using the same.

BACKGROUND ART

An infrared-emitting diode has widely been used in infrared-ray communications, infrared remote controllers, light sources for various sensors, night lighting devices, and the like.

Known is the following light-emitting diode having a wavelength in the vicinity of the above described peak wavelength. That is the light-emitting diode manufactured such that a compound semiconductor layer including an AlGaAs active layer is epitaxially grown on a GaAs substrate (see, for example, Patent Literatures 1 to 3). Lately, the highest output infrared-emitting diode is a so-called substrate removal type light-emitting diode in which a GaAs substrate used as a growth substrate is removed and a compound semiconductor layer is structured only of a growth layer that is transparent with respect to the emission wavelength (see, for example, Patent Literature 4).

On the other hand, in a case of an infrared-ray communication used in transmission between devices, for example, an infrared lay having the emission wavelength in a range from 850 nm to 900 nm is used and, in a case of a communication via an infrared remote control, for example, an infrared ray having an emission wavelength in a range from 880 nm to 940 nm, the range being considered as a highly-sensitive waveband to be received by a light receiving portion, is used. The infrared-emitting diode having an emission peak wavelength in a range from 880 nm to 890 nm and using an AlGaAs active layer containing Ge as an effective impurity is known as the infrared-emitting diode capable of being used in both of the infrared-ray communication for terminal equipment, e.g., cellular mobile phone having functions of both of an infrared-ray communication and a communication via infrared remote control, and the communication via an infrared remote control (see, Patent Literature 4).

An infrared-emitting diode using an InGaAs active layer is known as the infrared-emitting diode that can have the emission peak wavelength of 900 nm or more (see, Patent Literatures 5 to 7).

PRIOR ART LITERATURE

Patent Literature

Patent Literature 1
Japanese Unexamined Patent Application, First Publication No. Hei 06-21507
Patent Literature 2
Japanese Unexamined Patent Application, First Publication No. 2001-274454
Patent Literature 3
Japanese Unexamined Patent Application, First Publication No. Hei 07-38148
Patent Literature 4
Japanese Unexamined Patent Application, First Publication No. 2006-190792
Patent Literature 5
Japanese Unexamined Patent Application, First Publication No. 2002-26377
Patent Literature 6
Japanese Unexamined Patent Application, First Publication No. 2002-111048
Patent Literature 7
Japanese Unexamined Patent Application, First Publication No. 2002-344013

DISCLOSURE OF INVENTION

Problems to be Solved by the Invention

However, to the best of the applicant's knowledge, there is no bonding type infrared-emitting diode in which a functional substrate is attached (i.e., bonded) to an epitaxial wafer and a GaAs substrate after being used in growth is removed therefrom in order to improve an output of the infrared-emitting diode having an emission wavelength of 850 nm or more, particularly 900 nm or more.

In case where an AlGaAs active layer containing Ge is used as the effective impurity, it is difficult to cause the AlGaAs active layer to have the emission peak wavelength of 900 nm or more (see, FIG. 5 of Patent Literature 4).

With respect to the infrared-emitting diode using the InGaAs active layer capable of having the emission peak wavelength of 900 nm or more, development of the infrared-emitting diode having higher luminous efficiency is desired in view of a better performance, energy saving, and cost reduction.

The present invention has been made in light of the above circumstances and an object of the present invention is to provide an infrared-emitting diode that emits infrared light having the emission peak wavelength of 850 nm or more, particularly 900 nm or more, with a high output and high efficiency, and a light-emitting diode lamp and a lighting device using thereof.

Means for Solving the Problems

In order to achieve the aforementioned objects, the present inventors have intensively studied so as to solve the above problems and completed an infrared-emitting diode that emits infrared light having an emission peak wavelength of 850 nm or more, particularly 900 nm or more, with high output and high efficiency by configuring an infrared-emitting diode including an active layer having a multiquantum well structure in which well layers made of InGaAs and barrier layers made of AlGaAs are laminated and a quaternary mixed crystal AlGaInP in which cladding layers sandwich the active layer therebetween via guide layers made of AlGaAs, wherein a compound semiconductor layer including the active layer, the guide layers, and the cladding layers are epitaxially grown on a growth substrate and, thereafter, the compound semiconductor layer is attached (i.e., bonded) to a transparent substrate, followed by removal of the growth substrate.

First, the present inventors employed the well layer made of InGaAs so as to cause the infrared-emitting diode to have the emission peak wavelength of 850 or more, particularly 900 nm or more, the wavelength being used in the infrared-ray communication and the like, to form the active layer into a multiquantum well structure in order to improve monochromaticity and output power thereof.

The quaternary mixed crystal AlGaInP having satisfactory crystallinity is employed as the cladding layers which sandwich the multiquantum well structure of the ternary mixed crystal since the AlGaInP quaternary mixed crystal has a large band gap, is transparent with respect to the emission wavelength and does not contain As that tends to create defects.

As described above, in a conventional infrared-emitting diode using the InGaAs based active layer, the compound semiconductor layer including the active layer is not attached (i.e., bonded) to a transparent substrate but a GaAs substrate on which the compound semiconductor layer is grown is used as it is. However, the GaAs substrate is heavily doped in order to enhance conductivity thereof and thus absorption of light by a carrier is not avoidable. Therefore, employed is the infrared-emitting diode of a type that is attached (i.e., bonded) to a transparent substrate while the absorption of light by the carrier can be avoided and a high output and high efficiency can be expected.

In the InGaAs/AlGaAs multiquantum well structure, it is hard to match two layers according to lattice matching, so that the active layer comes to have a strained quantum well structure. The emission wavelength emitted from the strained quantum well structure largely depends on a composition and a thickness of the InGaAs. Also, the emission wavelength emitted from the strained quantum well structure produces a large effect on an output and monochromaticity thereof. Therefore, selection of the suitable composition and thickness provides better expectations on the high output and highly efficient light emission.

The present inventors advanced the studies based on the above knowledge to achieve the present invention having a configuration as described below.

The present invention provides the following configuration.

(1) A light-emitting diode, including a light emitting section including an active layer having a quantum well structure in which well layers having the composition: $(In_{X1}Ga_{1-X1})As$ ($0 \leq X1 \leq 1$) and barrier layers having the composition: $(Al_{X2}Ga_{1-X2})As$ ($0 \leq X2 \leq 1$) are alternately laminated, a first guide layer and a second guide layer which are paired to sandwich the active layer and have the composition: $(Al_{X3}Ga_{1-X3})As$ ($0 \leq X3 \leq 1$), and a first cladding layer and a second cladding layer which are paired to sandwich the active layer via the first guide layer and the second guide layer, respectively; a current diffusion layer formed on the light emitting section; and a functional substrate bonded to the current diffusion layer; wherein the first cladding layer and the second cladding layer have the composition: $(Al_{X4}Ga_{1-X4})_Y In_{1-Y}P$ ($0 \leq X4 \leq 1$, $0 < Y \leq 1$).

(2) The light-emitting diode according to the above item (1), wherein the In composition (X1) of the well layer satisfies the following condition: $0 \leq X1 \leq 0.3$.

(3) The light-emitting diode according to the above item (2), wherein the In composition (X1) of the well layer satisfies the following condition: $0.1 \leq X1 \leq 0.3$.

(4) The light-emitting diode according to any one of the above items (1) to (3), wherein the functional substrate is transparent with respect to the emission wavelength.

(5) The light-emitting diode according to any one of the above items (1) to (4), wherein the functional substrate is made of GaP or SiC.

(6) The light-emitting diode according to any one of the above items (1) to (5), wherein side surfaces of the functional substrate have vertical surfaces which are approximately vertical to a main light extracting surface at a side proximal to the light emitting section and inclined surfaces inclined inwardly with respect to the main light extracting surface at a side distal to the light emitting section.

(7) The light-emitting diode according to the above item (6), wherein the inclined surfaces include roughened surfaces.

(8) A light-emitting diode, including a light emitting section including an active layer having a quantum well structure in which well layers having the composition: $(In_{X1}Ga_{1-X1})As$ ($0 \leq X1 \leq 1$) and barrier layers having the composition: $(Al_{X2}Ga_{1-X2})As$ ($0 \leq X2 \leq 1$) are alternately laminated, a first guide layer and a second guide layer which are paired to sandwich the active layer and have the composition: $(Al_{X3}Ga_{1-X3})As$ ($0 \leq X3 \leq 1$), and a first cladding layer and a second cladding layer which are paired to sandwich the active layer via the first guide layer and the second guide layer, respectively; a current diffusion layer formed on the light emitting section; and a functional substrate bonded to the current diffusion layer, the functional substrate being disposed facing to the light emitting section and including a reflective layer having a reflectance of 90% or more with respect to an emission wavelength; wherein the first cladding layer and the second cladding layer have the composition: $(Al_{X4}Ga_{1-X4})_{Y3}In_{1-Y3}P$ ($0 \leq X4 \leq 1$, $0 < Y3 \leq 1$).

Here, the "bonding" also includes a case where the bonding is performed via a layer interposed between the reflective layer and the functional substrate.

(9) The light-emitting diode according to the above item (8), wherein the In composition (X1) of the well layer satisfies the following condition: $0 \leq X1 \leq 0.3$.

(10) The light-emitting diode according to the above item (9), wherein the In composition (X1) of the well layer satisfies the following condition: $0.1 \leq X1 \leq 0.3$.

(11) The light-emitting diode according to any one of the above items (8) to (10), wherein the functional substrate includes a layer made of silicon or germanium.

(12) The light-emitting diode according to any one of the above items (8) to (10), wherein the functional substrate includes a metal substrate.

(13) The light-emitting diode according to the above item (12), wherein the metal substrate is composed of a plurality of metal layers.

(14) The light-emitting diode according to any one of the above items (1) to (13), wherein the current diffusion layer is made of GaP or GaInP.

(15) The light-emitting diode according to any one of the above items (1) to (14), wherein the current diffusion layer has a thickness in a range from 0.5 μm to 20 μm.

(16) The light-emitting diode according to any one of the above items (1) to (13), wherein a first electrode and a second electrode are provided on a side of the main light extracting surface of the light-emitting diode.

(17) The light-emitting diode according to the above item (16), wherein the first electrode and the second electrode are Ohmic electrodes.

(18) The light-emitting diode according to the above item (16) or (17), which further includes a third electrode on a surface opposite to a side of the main light extracting surface of the functional substrate.

(19) A light-emitting diode lamp, including the light-emitting diode according to any one of the above items (1) to (18).

(20) A light-emitting diode lamp, including the light-emitting diode according to the above item (18); wherein the first and the third electrodes, or the second and the third electrodes are connected to each other at an approximately identical potential.
(21) A lighting device, comprising the light-emitting diode according to any one of the above items (1) to (18) and/or a plurality of light-emitting diode lamps according to either one of the above item (19) or (20).

Effects of the Invention

According to the above described configuration, the following effects are obtained.

The light-emitting diode of the present invention can emit infrared light having an emission peak wavelength of 850 nm or more, particularly 900 nm or more, with a high output and high efficiency.

Since the active layer has a multiquantum well structure in which the well layers having the composition: $(In_{X1}Ga_{1-X1})As$ ($0 \leq X1 \leq 1$) and the barrier layers having the composition: $(Al_{X2}Ga_{1-X2})As$ ($0 \leq X2 \leq 1$) are laminated alternately, the light emitting diode including the active layer having the above described structure is excellent in monochromaticity.

The configuration in which the functional substrate is transparent with respect to the emission wavelength can show the high output and high efficiency without allowing the functional substrate to absorb light emitted from the light emitting section.

The cladding layer has the composition: $(Al_{X4}Ga_{1-X4})_Y In_{1-Y}P$ ($0 \leq X4 \leq 1$, $0 < Y \leq 1$), i.e., the cladding layer does not include As that tends to create defectiveness, so that the cladding layer has high crystallinity and the cladding layer contributes to high output.

The cladding layer has the composition: $(Al_XGa_{1-X})_Y In_{1-Y}P$ ($0 \leq X \leq 1$, $0 < Y \leq 1$), so that the cladding layer has lower Al concentrate in comparison with the infrared-emitting diode in which the cladding layer thereof is made of the ternary mixed crystal. As a result thereof, the cladding layer has an improved moisture resistance.

The active layer has a configuration that the well layers having the composition: $(In_{X1}Ga_{1-X1})As$ ($0 \leq X1 \leq 1$) and the barrier layers having the composition: $(Al_{X2}Ga_{1-X}2)As$ ($0 < X2 \leq 1$) are laminated, so that the active layer is suitable to be produced in quantity by using the MOCVD method.

Since the functional substrate is made of GaP, SiC, silicon or germanium and thus is corrosion-inhibiting, the functional substrate has improved moisture resistance.

Since both of the functional substrate and the current diffusion layer are made of GaP, they can be bonded together with ease and can have a greater bonding strength.

Since the current diffusion layer is made of GaInP, the crystallinity can be enhanced by matching the current diffusion layer with the InGaAs based well layer according to the lattice matching.

The light-emitting diode lamp of the present invention can have the emission peak wavelength of 850 nm or more, particularly 900 nm or more, and is excellent in monochromaticity. Further, the light-emitting diode lamp of the present invention is equipped with the light-emitting diode with a high output and high efficiency and excellent in moisture resistance. Therefore, the light-emitting diode lamp of the present invention is suitable for a light source to be widely used for, for example, a sensor.

BEST MODE FOR CARRYING OUT THE INVENTION

Figure 1:
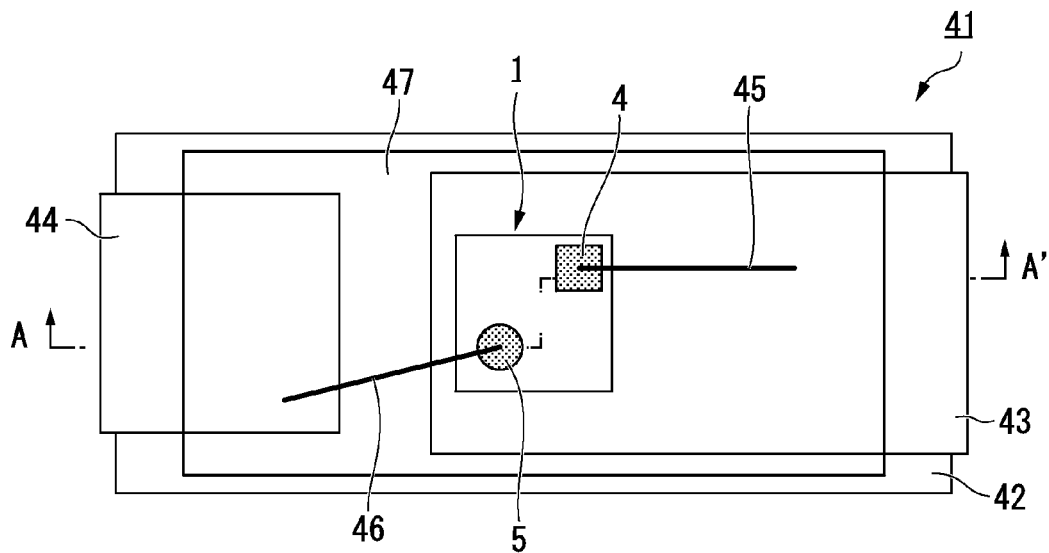
FIG. 1 is a plan view of a light-emitting diode lamp using a light-emitting diode according to an embodiment of the present invention.

With reference to drawings attached hereto, a description is made below in detail as to a light-emitting diode according to an embodiment to which the present invention is applied and a light-emitting diode lamp using the light-emitting diode. In the drawings used in the following description, featured portions may be enlarged for the sake of easy understanding of the characteristics of the present invention and thus a size ratio of each component does not always correspond to a size ratio of an actual component.

Light-Emitting Diode Lamp

Figure 2:
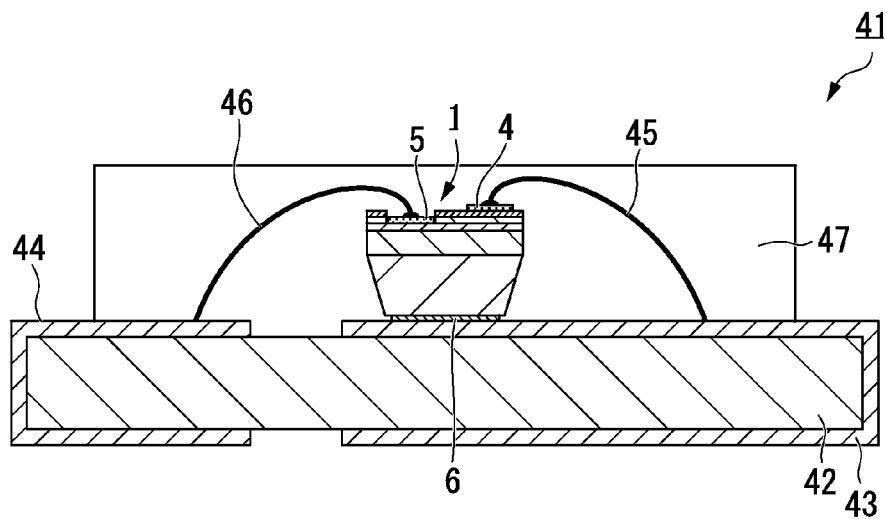
FIG. 2 is a schematic cross sectional view of the light-emitting diode lamp using the light-emitting diode according to the embodiment of the present invention of FIG. 1 taken along lines A-A'.

FIGS. 1 and 2 illustrate the light-emitting diode lamp using the light-emitting diode according to an embodiment to which the present invention is applied. FIG. 1 is a plan view of the light-emitting diode lamp. FIG. 2 is a cross sectional view of the light-emitting diode lamp of FIG. 1 taken along lines A-A'.

As illustrated in FIGS. 1 and 2, a light-emitting diode lamp 41 using a light-emitting diode 1 of the present embodiment is mounted with one or more light-emitting diodes 1 on a surface of a mount substrate 42.

More specifically, the surface of the mount substrate 42 is provided with an n-type electrode terminal 43 and a p-type electrode terminal 44. An n-type Ohmic electrode 4 as a first electrode and an n-type electrode terminal 43 of the mount substrate 42 of the light emitting diode 1 are connected to each other via a gold wire 45 (i.e., wire bonding). In contrast, a p-type Ohmic electrode 5 as a second electrode and the p-type electrode terminal 44 of the mount substrate 42 of the light-emitting diode 1 are connected to each other via a gold wire 46. As further illustrated in FIG. 2, a surface opposite to a surface on which the n-type Ohmic electrode 4 and the p-type Ohmic electrode 5 of the light-emitting diode 1 are provided is further provided with a third electrode 6. The third electrode 6 causes the light-emitting diode 1 to be connected onto the n-type electrode terminal 43 to be fixed to the mount substrate 42. Here, the n-type Ohmic electrode 4 and the third electrode 6 are electrically connected via the n-type electrode terminal 43 such that both electrodes are mutually equipotential or approximately equipotential. With the third electrode, the active layer can be prevented from being destroyed because, against an excessive reverse voltage, the excessive current does not flow over the active layer but a current flows across the third electrode and the p-type electrode. A reflecting structure may be added to the third electrode and a substrate interface side, thereby enabling a high output. An addition of a eutectic metal and a solder on a front surface side of the third electrode allows use of a simpler assembling technique such as a eutectic die bonding. The surface of the mount substrate 42 on which the light-emitting diode 1 is mounted is sealed with a general-use sealing resin 47 composed of, for example, a silicon resin and an epoxy resin.

Light-Emitting Diode

First Embodiment

Figure 3:
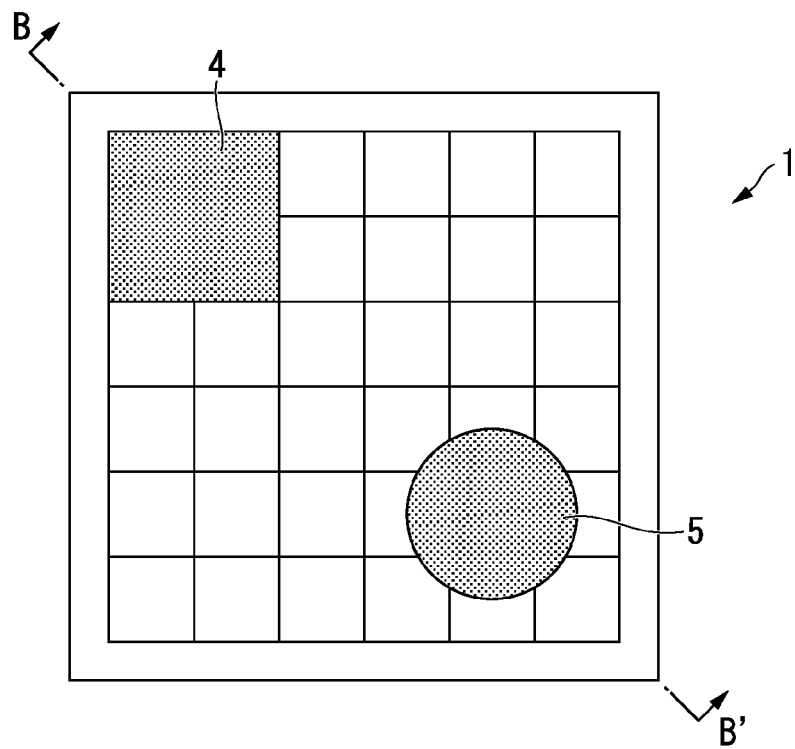
FIG. 3 is a plan view of the light-emitting diode according to the embodiment of the present invention.
Figure 4:
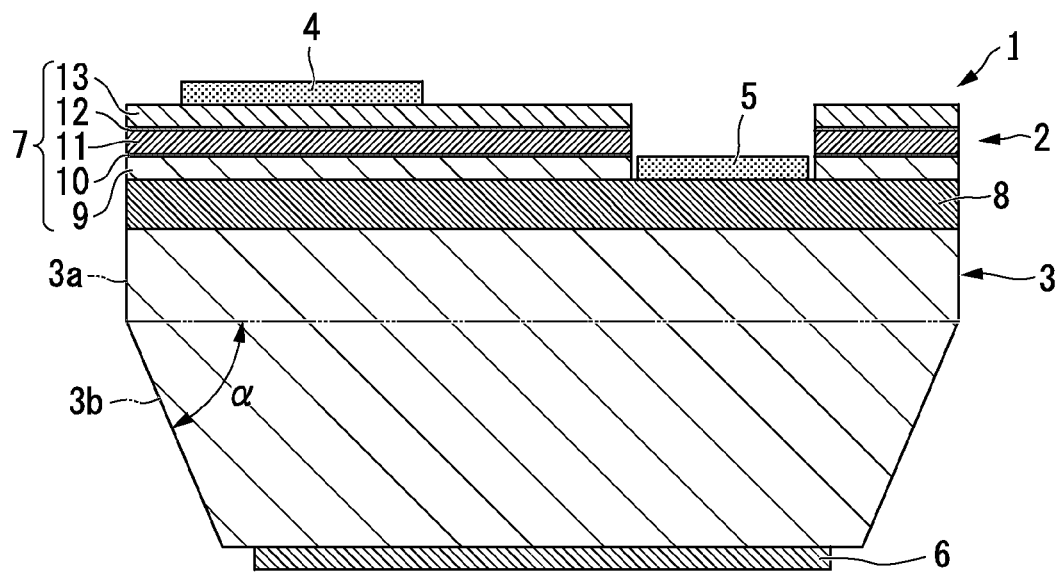
FIG. 4 is a schematic cross sectional view of the light-emitting diode according to the embodiment of the present invention of FIG. 3 taken along lines B-B'.
Figure 5:
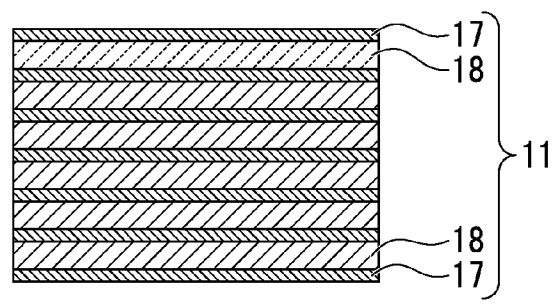
FIG. 5 illustrates an active layer composing the light-emitting diode according to the embodiment of the present invention.

FIGS. 3 and 4 illustrate a light-emitting diode according to a first embodiment to which the present invention is applied. FIG. 3 is a plan view of the light-emitting diode. FIG. 4 is a cross-sectional view of the light-emitting diode of FIG. 3 taken along lines B-B'. FIG. 5 is a cross sectional view illustrating a laminated structure composed of the well layers and the barrier layers.

The light-emitting diode according to the first embodiment comprises a light emitting section 7 including an active layer 11 having a quantum well structure in which well layers 17 having the composition: $(In_{X1}Ga_{1-X1})As$ ($0 \leq X1 \leq 1$) and barrier layers 18 having the composition: $(Al_{X2}Ga_{1-X2})As$ ($0 \leq X2 \leq$) are alternately laminated, a first guide layer 10 and a second guide layer 12 which are paired to sandwich the active layer 11 and have the composition: $(Al_{X2}Ga_{1-X2})As$ ($0 \leq X3 \leq 1$), a first cladding layer 9 and a second cladding layer 13 which are paired to sandwich the active layer 11 via the first guide layer 10 and the second guide layer 12, respectively, a current diffusion layer 8 formed on the light emitting section 7, and a functional substrate 3 bonded to the current diffusion layer 8, wherein the first cladding layer 9 and the second cladding layer 13 have the composition: $(Al_{X4}Ga_{1-X4})_Y In_{1-Y}P$ ($0 \leq X4 \leq 1$, $0 < Y \leq 1$).

The light-emitting diode 1 is schematically configured by equipping an n-type Ohmic electrode (i.e., first electrode) 4 and a p-type Ohmic electrode (i.e., second electrode) 5 provided on a main light extracting surface.

The main light extracting surface in the present embodiment is another surface of a surface to which a functional substrate 3 is attached in a compound semiconductor layer 2.

The compound semiconductor layer (also referred to as an epitaxial growth layer) 2 has a structure in which, as illustrated in FIG. 4, the p-n junction type light emitting section 7 and the current diffusion layer 8 are laminated in series. A publicly known functional layer can be added to the structure of the compound semiconductor layer 2, as required. Examples of the publicly known functional layer include a contact layer for decreasing a contact resistance of the Ohmic electrodes, a current diffusion layer for horizontally diffusing element drive currents over the entire light emitting section, and a current stopping layer and a current blocking layer for limiting an area across which an element drive current flows.

Preferably, the compound semiconductor layer 2 is epitaxially grown on a GaAs substrate.

The light emitting section 7 is configured such that, as illustrated in FIG. 4, at least a p-type lower cladding layer (i.e., first cladding layer) 9, a lower guide layer 10, an active layer 11, an upper guide layer 12, and an n-type upper cladding layer (i.e., second cladding layer) 13 are laminated in series on the current diffusion layer 8. In other words, the light emitting section 7 includes the lower cladding layer 9 and the lower guide layer 10, and the upper guide layer 12 and the upper cladding layer 13 provided at a lower side and at an upper side of the active layer 11, respectively, in order to "trap" a carrier and light emission for triggering a radiative recombination in the active layer 11. A so-called double hetero-structure (abbreviation in English: DH) is preferred in order to obtain high intensity light emission.

The active layer 11 has, as illustrated in FIG. 5, a quantum well structure in order to control an emission wavelength of the light-emitting diode (LED). That is, the active layer 11 includes barrier layers (also referred to as blocking layers) 18 at both ends of the active layer 11. The active layer 11 has a multilayered structure (i.e., laminated structure) in which well layers 17 and the barrier layers (also referred to as blocking layers) 18 are laminated.

Preferably, the active layer 11 has a thickness in a range from 50 nm to 1,000 nm. A conductive type of the active layer 11 is not limited to any type but is selectable from any one of an undope-type, p-type, or n-type. To enhance luminous efficiency, it is desirable to select the undope-type that has better crystallinity or a carrier concentration of less than $3 \times 10^{17}$ cm$^{-3}$.

Figure 6:
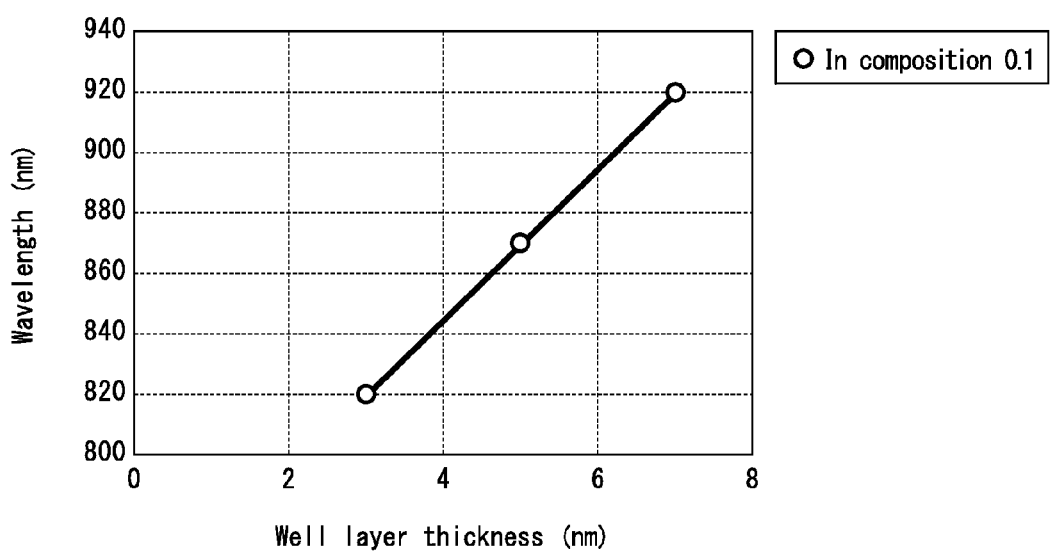
FIG. 6 is a graph showing a relationship between the film thickness and the emission peak wavelength of the well layer of the light emitting diode according to the embodiment of the present invention.

FIG. 6 illustrates a relationship between the film thickness and the emission peak wavelength of the well layer 17 when the In composition (X1) thereof is fixed to 0.1. Table 1 represents data values illustrated in FIG. 6. In Table 1, when the well layer becomes thicker, e.g., 3 nm, 5 nm, and 7 nm, the wavelength monotonically becomes longer, e.g., correspondingly, 820 nm, 870 nm, and 920 nm.

TABLE 1

| Well layer thickness (nm) | In composition 0.1 Wavelength (nm) |
|---|---|
| 3 | 820 |
| 5 | 870 |
| 7 | 920 |

Figure 7:
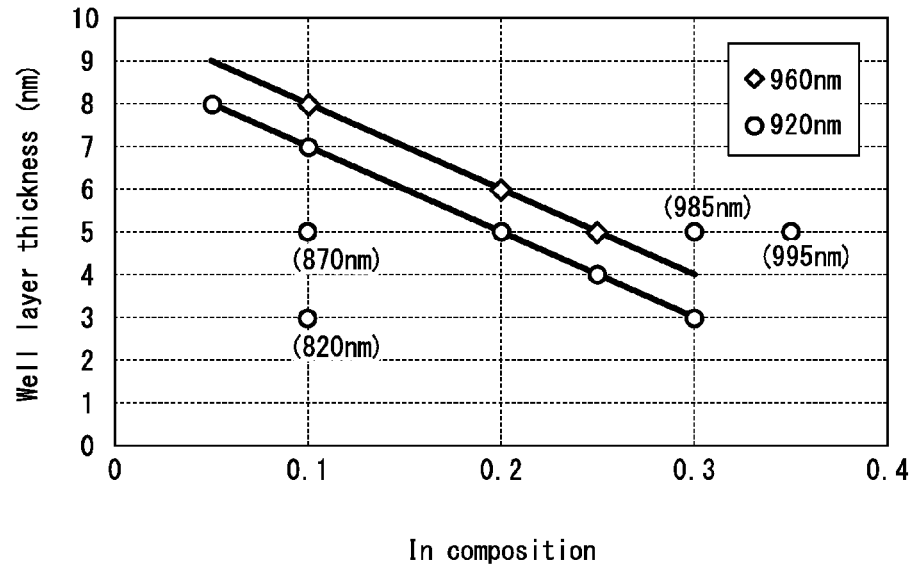
FIG. 7 is a graph showing a corresponding relationship among the In composition (X1), the thickness, and the emission peak wavelength of the well layer of the light-emitting diode according to the embodiment of the present invention.

FIG. 7 illustrates a relationship among the emission peak wavelength, the In composition (X1), and the film thickness of the well layer 17. FIG. 7 illustrates a combination of the In composition (X1) and the film thickness of the well layer 17 when the emission peak wavelength of the well layer 17 is a predetermined wavelength. Specifically, FIG. 7 illustrates a combination of the In composition (X1) and the film thickness of the well layer 17 when the emission peak wavelength of the well layer 17 is 920 nm and 960 nm, respectively. FIG. 7 also illustrates a combination of the In composition (X1) and the film thickness of the well layer 17 when emission peak wavelength of the well layer 17 is 820 nm, 870 nm, 985 nm, and 995 nm, respectively. Data values illustrated in FIG. 7 are shown in Table 2.

TABLE 2

| In composition | 820 nm Film thickness (nm) | 870 nm Film thickness (nm) | 920 nm Film thickness (nm) | 960 nm Film thickness (nm) | 985 nm Film thickness (nm) | 995 nm Film thickness (nm) |
|---|---|---|---|---|---|---|
| 0.05 | | | 8 | | | |
| 0.1 | 3 | 5 | 7 | 8 | | |
| 0.2 | | | 5 | 6 | | |
| 0.25 | | | 4 | 5 | | |
| 0.3 | | | 3 | | 5 | |
| 0.35 | | | | | | 5 |

In case of the emission peak wavelength is 920 nm, as the In composition (X1) decreases from 0.3 to 0.05, the film thickness monotonously correspondingly becomes thicker from 3 nm to 8 nm. In view of the above, any person skilled in the art can find out a combination of the In composition (X1) and the film thickness which provides the emission peak wavelength of 920 nm with ease.

Also, when the In composition (X1) is 0.1, if the film thickness becomes thicker, e.g., 3 nm, 5 nm, 7 nm, and 8 nm, the emission peak wavelength correspondingly becomes longer, e.g., correspondingly, 820 nm, 870 nm, 920 nm, and 960 nm. Further, when the In composition (X1) is 0.2, if the film thickness becomes thicker, e.g., 5 nm and 6 nm, the emission peak wavelength correspondingly becomes longer, e.g., correspondingly, 920 nm and 960 nm. Further, when the In composition (X1) is 0.25, if the film thickness becomes thicker, e.g., 4 nm and 5 nm, the emission peak wavelength becomes longer, e.g., correspondingly, 920 nm and 960 nm. Still further, when the In composition (X1) is 0.3, if the film thickness becomes thicker, e.g., 3 nm and 5 nm, the emission peak wavelength becomes longer, e.g., correspondingly, 920 nm and 985 nm.

When the film thickness is 5 nm, if the In composition (X1) increases, e.g., 0.1, 0.2, 0.25, and 0.3, the emission peak wavelength becomes longer, e.g., correspondingly, 870 nm, 920 nm, 960 nm, and 985 nm. Here, if the In composition (X1) becomes 0.35, the emission peak wavelength becomes 995 nm.

In FIG. 7, if a combination of a value of the In composition (X1) and a value of the film thickness is connected when the emission peak wavelength is 920 nm and 960 nm, respectively, each combination shows an approximate straight line. Also, a line resulting from the connection of the combination of a value of the In composition (X1) and a value of the film thickness when predetermined emission peak wavelength of the waveband is 850 nm or more and up to about 1,000 nm is assumed to be an approximate straight line. Further, the line connecting the combination is positioned lower left of the graph as the emission peak wavelength is shorter and positioned upper right as the emission peak wavelength is longer.

Based on the above described regularity, combinations of the In composition (X1) and the film thickness which have a predetermined emission peak wavelength of 850 nm or more and 1,000 nm or less can be found with ease.

Figure 8:
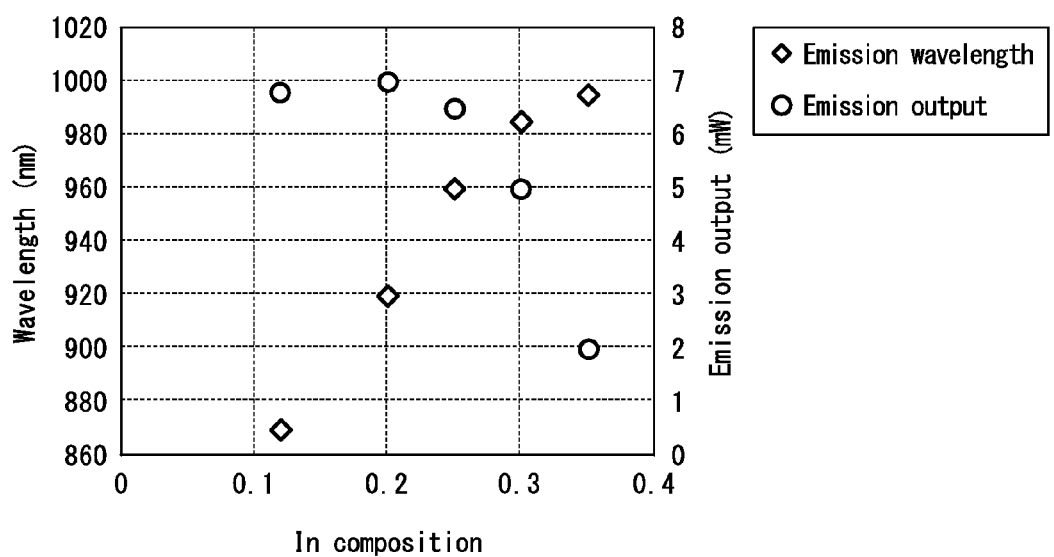
FIG. 8 is a graph showing a relationship among the In composition (X1), the emission peak wavelength, and the emission output of the well layer of the light-emitting diode according to the embodiment of the present invention.

FIG. 8 illustrates a relationship between the In composition (X1), the emission peak wavelength, and an emission output of the well layer 17 when the film thickness of the well layer 17 is fixed to 5 nm. Table 3 represents data values illustrated in FIG. 8.

As the In composition (X1) increases, e.g., 0.12, 0.2, 0.25, 0.3, and 0.35, the emission peak wavelength becomes longer, e.g., correspondingly, 870 nm, 920 nm, 960 nm, 985 nm, and 995 nm. More specifically, as the In composition (X1) increases from 0.12 to 0.3, the emission peak wavelength becomes longer from 870 nm to 985 nm approximately monotonically. When the In composition (X1) increases from 0.3 to 0.35, the peak wavelength becomes longer from 985 nm to 995 nm. However, a rate of change to a long wavelength becomes smaller.

When the emission peak wavelength is 870 nm (X1=0.12), 920 nm (when X1 is 0.2; X1=0.2), and 960 nm (when X1 is 0.25; X1=0.25), an emission output shows a large value such as 6.5 mW. Also, when the emission peak wavelength is 985 nm (when X1 is 0.3; X1=0.3), the emission output shows a practically sufficiently large value such as 5 mW. However, when the emission peak wavelength is 995 nm (when X1 is 0.35; X1=0.35), the emission output shows a small value such as 2 mW.

TABLE 3

| | Well layer thickness 5 nm | |
|---|---|---|
| In composition | Wavelength (nm) | Output (mW) |
| 0.12 | 870 | 6.8 |
| 0.2 | 920 | 7 |
| 0.25 | 960 | 6.5 |
| 0.3 | 985 | 5 |
| 0.35 | 995 | 2 |

Preferably, the well layer 17 has the composition: $(In_{X1}Ga_{1-X1})As$ ($0 \leq X1 \leq 0.3$) based on FIGS. 6 to 8. The X1 can be adjusted to a predetermined emission peak wavelength.

In case where the emission peak wavelength is 900 nm or more, X1 preferably satisfies the following conditions: $0.1 \leq X1 \leq 0.3$. In case where the emission peak wavelength is less than 900 nm, X1 preferably satisfies the following conditions: $0 \leq X1 \leq 0.1$.

The well layer 17 suitably has a film thickness in a range from 3 nm to 20 nm. More preferably, the well layer 17 has a film thickness in a range from 3 nm to 10 nm.

The barrier layer 18 has the composition: $(Al_{X2}Ga_{1-X2})As$ ($0 \leq X2 \leq 1$). X preferably has the composition that allows larger band gap than that of the well layer 17, more preferably, has the composition in a range from 0 to 0.4.

Preferably, the barrier layer 18 has a film thickness equal to or more than the film thickness of the well layer 17. Accordingly, the luminous efficiency of the well layer 17 can be increased.

Figure 9:
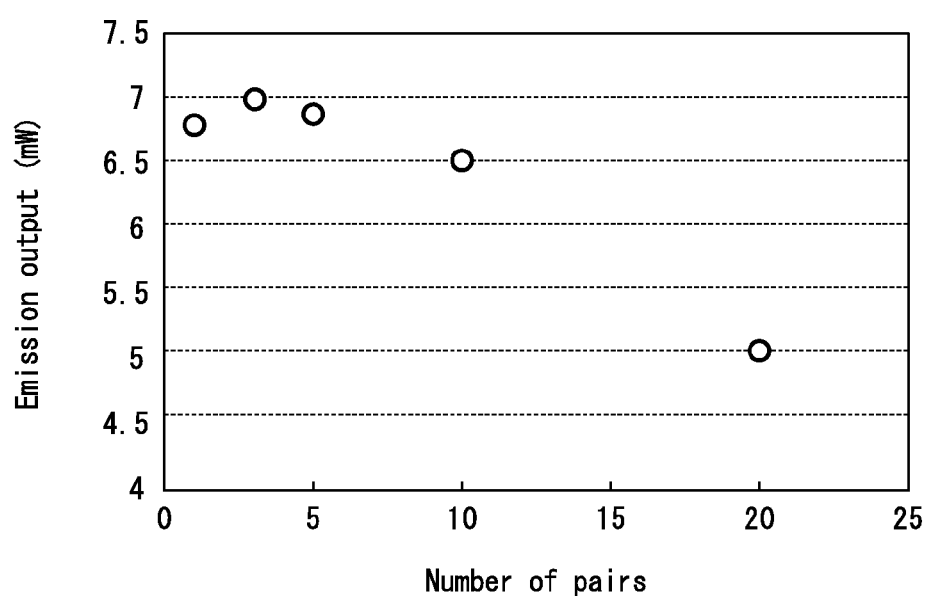
FIG. 9 is a graph showing a relationship between the number of pairs of a well layer and a barrier layer, and the emission output of the light-emitting diode according to the embodiment of the present invention.

FIG. 9 illustrates a relationship between the number of pairs of the well layer and the barrier layer, and the emission output when the well layer 17 has the film thickness of 5 nm and the In composition (X1) is equal to 0.2. Table 4 represents values of data illustrated in FIG. 9.

It is found that the emission output shows a high value such as 6.5 mW or more in case where the number of pairs is in a range from 1 pair to 10 pairs and has a practically sufficiently high value such as 5 mW in a case of 20 pairs. It is assumed that, as the number of pairs becomes more, the emission output decreases.

TABLE 4

Well layer thickness 5 nm/In composition 0.2

| Number of pairs | Output (mW) |
|---|---|
| 1 | 6.8 |
| 3 | 7 |
| 5 | 6.9 |
| 10 | 6.5 |
| 20 | 5 |

In the multilayered structure composed of the well layers 17 and the barrier layers 18, the number of pairs made such that the well layers 17 and the barrier layers 18 are paired and alternately laminated is not limited to any number. However, the number of pairs in a range from 1 pair to 10 pairs is preferable in view of FIG. 9. In other words, the active layer 11 preferably includes 1 to 10 layers of the well layers 17. Here, with respect to the luminous efficiency of the active layer 11, a suitable range of the number of the well layers 17 is at least one layer, and may be one layer. On the other hand, since there are a lattice misfit and a low carrier concentration between the well layer 17 and the barrier layer 18, if many pairs are made, a crystal defect may occur to invite decrease of the luminous efficiency or increase of the forward voltage ($V_F$). The preferable number of pairs is 10 pairs or less. More preferable number of pairs is 5 pairs or less.

The lower guide layer 10 and the upper guide layer 12 are, as illustrated in FIG. 4, provided on the lower surface and the upper surface of the active layer 11, respectively. Specifically, the lower guide layer 10 is provided on the lower surface of the active layer 11 and the upper guide layer 12 is provided on the upper surface of the active layer 11.

The lower guide layer 10 and the upper guide layer 12 have the composition: $(Al_{X3}Ga_{1-X3})As$ ($0 \leq X3 \leq 1$). Preferably, X3 has the composition that is equivalent to the band gap of the barrier layer 18 or that is larger than the band gap of the barrier layer 18, more preferably, has the composition of the band gap in a range from 0.2 to 0.4.

The lower guide layer 10 and the upper guide layer 12 are provided in order to decrease propagation of default between the lower cladding layer 9 and the active layer 11 and between the upper cladding layer 13 and the active layer 11, respectively. In the present invention, a group V composing element of the active layer 11 is arsenic (As), whereas, a group V composing element of the lower cladding layer 9 and the upper cladding layer 13 is phosphorus (P). Therefore, default tends to occur at an interface between the active layer 11 and the lower cladding layer 9 and between the active layer 11 and the upper cladding layer 13. The propagation of the default to the active layer 11 becomes a factor that causes degradation of performance of the light-emitting diode. To effectively decrease the propagation of the default, the lower guide layer 10 and the upper guide layer 12 preferably have a film thickness of 10 nm or more, and more preferably from 20 nm to 100 nm.

The conductive type of each of the lower guide layer 10 and the upper guide layer 12 is not limited to any conductive type but is selectable from any one of the undope-type, p-type, or n-type. To enhance the luminous efficiency, the lower guide layer 10 and the upper guide layer 12 desirably are of the undope-type and have the carrier concentration of less than $3 \times 10^{17}$ cm$^{-3}$ for the sake of better crystallinity.

The lower cladding layer 9 and the upper cladding layer 13 are, as illustrated in FIG. 4, provided on a lower surface of the lower guide layer 10 and an upper surface of the upper guide layer 12, respectively.

Preferably, the lower cladding layer 9 and the upper cladding layer 13 are made of a semiconductor material having the composition: $(Al_{X4}Ga_{1-X4})_Y In_{1-Y}P$ ($0 \leq X4 \leq 1$, $0 < Y \leq 1$). More preferably, the lower cladding layer 9 and the upper cladding layer 13 are made of a material having a band gap larger than a band gap of the barrier layer 15. Further preferably, the lower cladding layer 9 and the upper cladding layer 13 are made of a material having a band gap larger than band gaps of the lower guide layer 10 and the upper guide layer 12. Preferably, in the above material, X4 has the composition: $(Al_{X4}Ga_{1-X4})_Y In_{1-Y}P$ ($0 \leq X4 \leq 1$, $0 < Y \leq 1$) in a range from 0.3 to 0.7. Preferably, Y has the composition in a range from 0.4 to 0.6.

The lower cladding layer 9 and the upper cladding layer 13 have different polarities. A carrier concentration and a film thickness of each of the lower cladding layer 9 and the upper cladding layer 13 may be in any suitable range known to public. It is preferable to optimize conditions such that the luminous efficiency of the active layer 11 increases. By controlling the compositions of the lower cladding layer 9 and the upper cladding layer 13, warping of the compound semiconductor layer 2 can be decreased.

Specifically, the lower cladding layer 9 is desirably made of the semiconductor material having, for example, a composition of Mg-doped p-type $(Al_{X4a}Ga_{1-X4a})_{Ya} In_{1-Ya}P$ ($0.3 \leq X4a \leq 0.7$, $0.4 \leq Ya \leq 0.6$). Further, the lower cladding layer 9 preferably has a carrier concentration in range from $2 \times 10^{17}$ cm$^{-3}$ to $2 \times 10^{18}$ cm$^{-3}$. Still further, the lower cladding layer 9 preferably has a film thickness in a range from 0.1 μm to 1 μm.

On the other hand, the upper cladding layer 13 is desirably made of the semiconductor material having the composition of, for example, Si-doped n-type $((Al_{X4b}Ga_{1-X4b})_{Yb} In_{1-Yb}P$ ($0.3 \leq X4b \leq 0.7$, $0.4 \leq Yb \leq 0.6$). Further, the upper cladding layer 13 preferably has a carrier concentration in a range from $1 \times 10^{17}$ cm$^{-3}$ to $1 \times 10^{18}$ cm$^{-3}$. Still further, the upper cladding layer 13 preferably has a film thickness in a range from 0.1 μm to 1 μm.

A polarity of each of the lower cladding layer 9 and the upper cladding layer 13 can be selected in consideration with a device structure of the compound semiconductor layer 2.

Above the composition layers composing the light emitting section 7, a publicly known layer structure including a contact layer for decreasing a contact resistance of the Ohmic electrode, a current diffusion layer for diffusing an element drive current over the entire light emitting section, and, by contraries, a current stopping layer and a current blocking layer for limiting an area where the element drive current flows can be provided.

A current diffusion layer 8 is, as illustrated in FIG. 4, provided below the light emitting section 7. The current diffusion layer 8 can be made of a material transparent with respect to the emission wavelength from the light emitting section 7 (i.e., active layer 11) such as GaP and GaInP.

In case where the current diffusion layer 8 is made of the GaP, the formation of the functional substrate 3 into a GaP substrate exerts effects of easy bonding and satisfactory bonding strength.

In case where the current diffusion layer 8 is made of the GaInP, a change of a ratio of Ga and In produces an effect that the current diffusion layer 8 is caused to have a lattice constant identical to the InGaAs as the material of the well layer 17 on which the current diffusion layer 8 is laminated, thereby enabling the current diffusion layer 8 to match the well layer 17 according to the lattice matching. Therefore, it is preferable to select a composition ratio of GaInP so as to allow the current diffusion layer 8 to have the lattice constant identical to the composition ratio of InGaAs selected from the desired emission peak wavelength.

Preferably, the current diffusion layer 8 has a thickness in a range from 0.5 μm to 20 μm. In case of the thickness of 0.5 or less, sufficient current diffusion cannot be obtained. In case of the thickness of 20 μm or more, it becomes costly in growing crystal up to the thickness.

The functional substrate 3 is bonded to a surface of another side of the main light extracting surface of the compound semiconductor layer 2. In other words, the functional substrate 3 is bonded, as illustrated in FIG. 4, to a side of the current diffusion layer 8 composing the compound semiconductor layer 2. The functional substrate 3 has a sufficient strength for mechanically supporting the light emitting section 7 and is made of a material which has a wide band gap and is optically transparent with respect to the emission wavelength from the light emitting section 7.

Preferably, the functional substrate 3 is formed into a substrate excellent in moisture resistance. More preferably, the functional substrate 3 is made of GaP, GaInP, or SiC having satisfactory heat conductivity, or is made of sapphire having satisfactory mechanical strength. Further preferably, the functional substrate 3 has a thickness, for example, of about 50 μm or more in order to support the light emitting section 7 with the sufficient mechanical strength. Still further preferably, the functional substrate 3 has the thickness of about 300 μm or more in order to provide mechanical processing to the functional substrate 3 with ease after it is bonded to the compound semiconductor layer 2. The optimum functional substrate 3 is made of an n-type GaP substrate with a film thickness of about 50 μm or more and about 300 μm or less in view of costs and transparency thereof.

As illustrated in FIG. 4, each of side surfaces of the functional substrate 3 is formed into a vertical surface 3a that is approximately vertical to the main light extracting surface at a side near to the compound semiconductor layer 2, whereas, is formed into an inclined surface 3b that extends inwardly with respect to the main light extracting surface at a side distal to the compound semiconductor layer 2. Accordingly, light emitted to a side of the functional substrate 3 from the active layer 11 can be extracted to the outside efficiently. The light emitted to the side of the functional substrate 3 from the active layer 11 is partially reflected by the vertical surfaces 3a to be extracted from the inclined surfaces 3b. On the other hand, the light reflected by the inclined surfaces 3b can be extracted from the vertical surfaces 3a. As described above, a synergetic effect produced by the vertical surfaces 3a and the inclined surfaces 3b can enhance light extraction efficiency.

In the present embodiment, as illustrated in FIG. 4, an angle α between each inclined surface 3b and a surface in parallel with a light emitting face is preferably set in a range from 55° to 80°. With the angle range, light reflected on a bottom section of the functional substrate 3 can be extracted to the outside efficiently.

Preferably, a depth (i.e., thickness direction) of the vertical surface 3a is in a range from 30 μm to 100 μm. The depth of the vertical surface 3a within the above range can return the light reflected on the bottom section of the functional substrate 3 to the light emitting face efficiently in the vertical surfaces 3a and can emit the reflected light from the main light extracting surface. With the above configuration, the luminous efficiency of the light-emitting diode 1 can be improved.

Preferably, each inclined surface 3b of the functional substrate 3 is formed into a rough surface. By forming the inclined surface 3b into the rough surface, the light extracting efficiency in each inclined surface 3b can be increased. In other words, formation of each inclined surface 3b into the rough surface enables control of total reflection of light reflected on each inclined surface 3b to thereby increase the light extracting efficiency.

The functional substrate 3 has a reflectance of 90% or more with respect to the emission wavelength and can include a reflective layer (not illustrated) to be disposed facing to the light emitting section. With the above configuration, light can be efficiently extracted from the main light extracting surface.

The reflective layer is made of, for example, silver (Ag), aluminum (Al), gold (Au), or an alloy thereof. These materials have a high reflectivity and thus more than 90% of the light from a reflective layer 23 can be reflected.

In the functional substrate 3, the reflective layer can be bonded to an inexpensive substrate made of silicon, germanium, and the like, such substrate having heat expansion coefficient near to that of the light emitting section, via the eutectic metal such as AuIn, AuGe, and AuSn. Particularly, the AuIn is the optimum bonding material to be combined with the most inexpensive silicon substrate (i.e., silicon layer) although the AuIn has a low bonding temperature and the heat expansion coefficient different from the light emitting section.

It is desirable, in view of a stability of quality, to insert a refractory metal such as Ti, W, and Pt or a transparent conducting oxide such as ITO into the functional substrate 3 in order to avoid counter diffusion of the current diffusion layer, the reflection metal, and the eutectic metal.

A bonded interface between the compound semiconductor layer 2 and the functional substrate 3 may be formed into a high resistivity layer. In other words, the high resistivity layer (not illustrated) is sometimes provided between the compound semiconductor layer 2 and the functional substrate 3. The high resistivity layer shows a resistance value higher than that of the functional substrate 3 and, in case where the high resistivity layer is provided, has a function of decreasing a reverse current flowing from a side of the current diffusion layer 8 of the compound semiconductor layer 2 to a side of the functional substrate 3. The above bonded structure exerts voltage endurance with respect to an inverse voltage unintentionally applied to the side of the current diffusion layer 8 from the side of the functional substrate 3. However, a breakdown voltage thereof preferably is lower than the inverse voltage of a p-n junction type light emitting section 7.

An n-type Ohmic electrode (i.e., first electrode) 4 and a p-type Ohmic electrode (i.e., second electrode) 5 are low resistance Ohmic contact electrodes provided on the main light extracting surface of the light-emitting diode 1. Here, the n-type Ohmic electrode 4 is provided above the upper cladding layer 11 and can be made of an alloy composed of, for example, AuGe, a Ni alloy/Au. On the other hand, the p-type Ohmic electrode 5 may include, as illustrated in FIG. 4, an alloy composed of AuBe/Au or AuZn/Au so as to be provided on an exposed surface of the current diffusion layer 8.

Here, in the light-emitting diode 1 of the present embodiment, it is preferable to form the p-type Ohmic electrode 5 as the second electrode on the current diffusion layer 8. With the above configuration, an effect of decreasing an operating voltage can be produced. Formation of the p-type Ohmic electrode 5 on the current diffusion layer 8 made of p-type GaP enables to obtain satisfactory Ohmic contact. Therefore, the operating voltage can be decreased.

In the present embodiment, it is preferable that the first electrode is an n-type electrode and the second electrode is the p-type electrode. With the above configuration, a high intensity light-emitting diode 1 can be realized. On the other hand, in a case of the p-type first electrode, the current diffusion level is degraded, resulting in inviting the lower intensity. In case of the n-type first electrode, the current diffusion becomes stronger and the high intensity light-emitting diode 1 can be achieved.

In the light-emitting diode 1 of the present embodiment, as illustrated in FIG. 3, it is preferable that the n-type Ohmic electrode 4 and the p-type Ohmic electrode 5 are diagonally positioned. Most preferably, the compound semiconductor layer 2 is configured to enclose the p-type Ohmic electrode 5. With the configuration, an effect of decreasing the operating voltage can be produced. The p-type Ohmic electrode 5 is encircled by the n-type Ohmic electrode 4. Therefore, a current can easily flow to every direction, resulting in inviting decrease of the operating voltage.

In the light-emitting diode 1 of the present embodiment, as illustrated in FIG. 3, it is preferable that the n-type Ohmic electrode 4 is formed into a reticulated grating such as a honey comb shape and a lattice shape. Improved reliability can be obtained as an effect of such a configuration. With the lattice shape, the current can be uniformly injected into the active layer 11. As the effect thereof, the improved reliability can be obtained.

In the light-emitting diode 1 of the present embodiment, it is preferable that the n-type Ohmic electrode 4 is configured with a pad shaped electrode (i.e., pad electrode) and a line shaped electrode (i.e., linear electrode) having a width of 10 μm or less. With the above configuration, a high intensity can be obtained. Further, by narrowing the width of the linear electrode, an opening area of the light extracting surface can be made wider, thereby achieving the higher intensity.

The third electrode is formed on a rear surface of the functional substrate. The transparent substrate can provide a higher output by causing the transparent substrate to have a configuration in which light is reflected to a side of the substrate. Examples of a specular metal material include Au, Ag, Al, and the like.

A front surface side of the electrode is made of, for example, a eutectic metal such as AuSn and a semiconductor material. As a result thereof, it becomes unnecessary to use paste in the course of a die bond processing any more, i.e., the processing is simplified. Further, connection via a metal enhances thermal conductivity to thereby improve discharge characteristics of the light-emitting diode.

Method for Manufacturing Light-Emitting Diode

Figure 10:
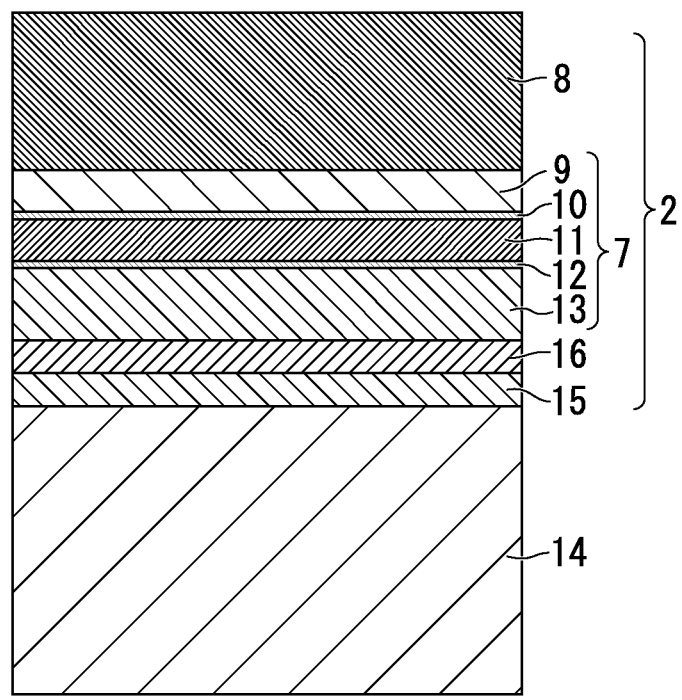
FIG. 10 is a schematic cross sectional view of an epitaxial wafer to be used in the light-emitting diode according to the embodiment of the present invention.
Figure 11:
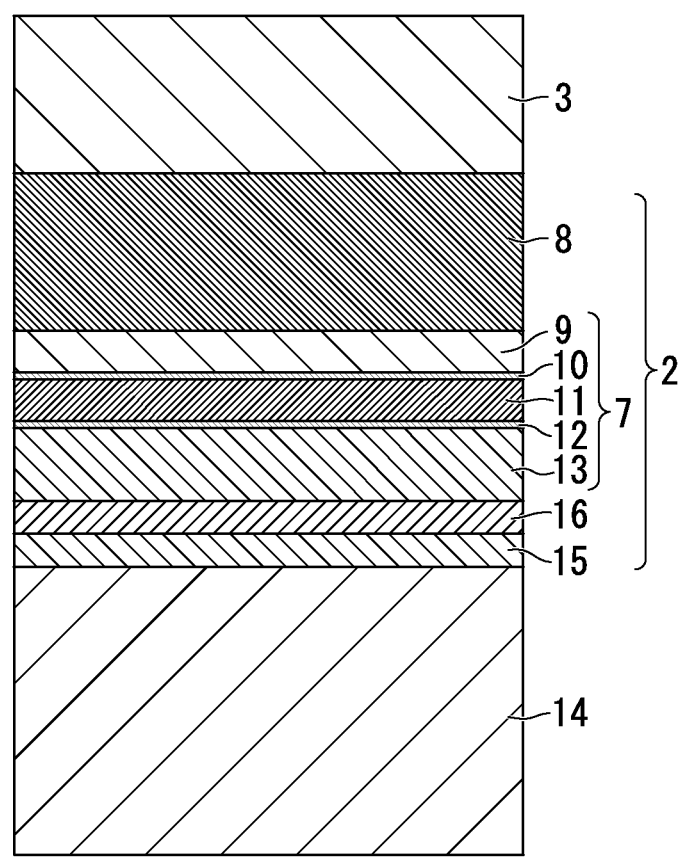
FIG. 11 is a schematic cross sectional view of a bonded wafer to be used in the light-emitting diode according to the embodiment of the present invention.

A method for manufacturing the light-emitting diode 1 of the present embodiment will be described below. FIG. 10 is a cross sectional view of an epitaxial wafer to be used for the light-emitting diode 1 of the present embodiment. FIG. 11 is a cross sectional view of a bonded wafer to be used for the light-emitting diode 1 of the present embodiment.
(Processing for Forming Compound Semiconductor Layer)

Initially, the compound semiconductor layer 2 as illustrated in FIG. 10 is manufactured. The compound semiconductor layer 2 includes a buffer layer 15 made of GaAs, an etching stop layer (not illustrated) provided for the purpose of selective etching, an Si-doped n-type contact layer 16, the n-type upper cladding layer 13, the upper guide layer 12, the active layer 11, the lower guide layer 10, the p-type lower cladding layer 9, and the current diffusion layer 8 that is made of Mg-doped p-type GaP such that they are sequentially laminated on the GaAs substrate 14.

A commercially obtainable single crystal substrate that is manufactured by a publicly known method can be used as the GaAs substrate 14. A surface of the GaAs substrate 14 to be subjected to the epitaxial growth desirably has a smooth surface. With respect to a plane direction of a surface of the GaAs substrate 14, a substrate which is epitaxial-growth susceptible, has a mass-produced (100) surface, and is shifted within ±20° from the (100) is desirable in view of stability of quality of the substrate. More preferably, a range of the plane direction of the GaAs substrate 14 is shifted from the direction (100) to a direction (0-1-1) by 15° with an error of ±5°.

As used herein, "-" indicates a bar attached to an index immediately after the "-" in a description of the Miller indices.

A lower dislocation density of the GaAs substrate 14 is desirable in order to obtain better crystallinity of the compound semiconductor layer 2. Specifically, the suitable dislocation density is, for example, 10,000 atoms cm$^{-2}$ or less, and desirably 1,000 atoms cm$^{-2}$ or less.

The GaAs substrate 14 may be either one of the n-type substrate or p-type substrate. The carrier concentration of the GaAs substrate 14 can be selected, as required, based on a desired electric conductivity and device structure. For example, in case where the GaAs substrate 14 is a silicon-doped n-type substrate, the preferable carrier concentration is in a range from $1 \times 10^{17}$ to $5 \times 10^{18}$ cm$^{-3}$. To the contrary, in case where the GaAs substrate 14 is a zinc-doped p-type substrate, a preferable carrier concentration is in a range from $2 \times 10^{18}$ to $5 \times 10^{19}$ cm$^{-3}$.

A thickness of the GaAs substrate 14 has an appropriate range according to a size thereof. If the thickness of the GaAs substrate 14 is less than the appropriate range, the GaAs substrate 14 may be broken during a manufacturing process of the compound semiconductor layer 2. On the other hand, if the thickness of the GaAs substrate 14 is more than the appropriate range, material costs increase. Therefore, in case where the GaAs substrate 14 has a large size, e.g., in a case of 75 mm, the GaAs substrate 14 desirably has a thickness in a range from 250 μm to 500 μm in order to prevent the GaAs substrate 14 from being broken during handling thereof. Similarly, for example, in a case of a diameter of 50 mm, a desirable thickness of the GaAs substrate 14 is in a range from 200 μm to 400 μm. In case of a diameter of 100 mm, a desirable thickness of the GaAs substrate 14 is in a range from 350 μm to 600 μm.

As described above, by making the substrate thicker according to the size of the GaAs substrate 14, the warping of the compound semiconductor layer 2 caused by the light emitting section 7 can be decreased. Accordingly, since a temperature distribution during the epitaxial growth becomes uniform, a wavelength distribution within the surface of the active layer 11 can be made smaller. The GaAs substrate 14 is not necessarily limited to a circular shape but may be any other shape such as a rectangular shape.

A buffer layer 15 is provided in order to decrease the propagation of a default between the GaAs substrate 14 and the composition layers composing the light emitting section 7. Therefore, the buffer layer 15 is not always essential if quality or epitaxial growth conditions of the substrate is selected. Preferably, the buffer layer 15 is made of a material identical to that of the substrate to be subjected to the epitaxial growth. Therefore, in the present embodiment, the GaAs is preferably used for the buffer layer 15, as similar to the GaAs substrate 14. Further, a multilayered film made of materials different from the GaAs substrate 14 can be used for the buffer layer 15 in order to decrease the propagation of the default. The thickness of the buffer layer 15 is preferably 0.1 μm or more, and more preferably 0.2 μm or more.

A contact layer 16 (not illustrated in FIG. 4) is provided in order to decrease a contact resistance with the electrode. The contact layer 16 is preferably made of a material having a band gap larger than that of the active layer 11, i.e., $Al_XGa_{1-X}As$ and $(Al_XGa_{1-X})_YIn_{1-Y}P$ ($0 \leq X \leq 1$, $0 < Y \leq 1$) can be suitably used. The lower limit of the carrier concentration of the contact layer 16 is $5 \times 10^{17}$ cm$^{-3}$ or more, and more preferably $1 \times 10^{18}$ cm$^{-3}$ or more, in order to decrease the contact resistance with the electrode. The upper limit of the carrier concentration is desirably $2 \times 10^{19}$ cm$^{-3}$ or less as a range that the decrease of the crystallinity tends to occur. Preferably, the contact layer 16 has a thickness of 0.5 µm or more, wherein the most optimum thickness is 1 mm or more. The upper limit of the thickness of the contact layer 16 is not limited but is desirably 5 µm or less in order to keep costs for the epitaxial growth within the appropriate range.

In the present embodiment, the publicly known growth method such as the molecular beam epitaxial method (MBE method) and the decompression metal-organic chemical vapor deposition method (MOCVD method) can be applied. It is most preferable to apply the MOCVD method that is excellent in mass-productivity. Specifically, the GaAs substrate 14 to be used in the epitaxial growth of the compound semiconductor layer 2 desirably performs preprocessing such as a cleaning process and a thermal process before the growth in order to remove contamination and a natural oxide film on the surface. Each layer composing the compound semiconductor layer 2 can be laminated such that the GaAs substrate 14 having a diameter in a range from 50 mm to 150 mm is disposed in the MOCVD device and concurrently epitaxially grows each layer. Examples of the MOCVD device include commercially available large equipment such as rotation/revolution type equipment and high speed rotation type equipment.

When each layer of the compound semiconductor layer 2 is epitaxially grown, for example, trimethyl aluminum (($CH_3)_3Al$), trimethyl gallium (($CH_3)_3Ga$), and trymethyl indium (($CH_3)_3In$) can be used as materials for a group III composing elements. For example, biscyclopentadienyl magnesium (bis-($C_5H_5)_2Mg$) or the like can be used as an Mg doping material. For example, disilane ($Si_2H_6$) and the like can be used as a Si doping material.

Phosphine ($PH_3$), arsine ($AsH_3$), and the like can be used as materials of the group V composing elements.

A growing temperature of each layer can be set, in case where p-type GaP is used as the current diffusion layer 8, in a range from 720° C. to 770° C. and, in a case of the other layers, in a range from 600° C. to 700° C.

In case where a p-type GaInP is used as the current diffusion layer 8, a growing temperature thereof can be set in a range from 600° C. to 700° C.

A carrier concentration, a film thickness, and temperature conditions of each layer can be selected, as required.

Thus manufactured compound semiconductor layer 2 can obtain satisfactory surface condition including less crystal defect although the compound semiconductor layer 2 includes the light emitting section 7. The compound semiconductor layer 2 may be subjected to a surface finishing such as polishing in accordance with the device structure.

(Bonding Process of Functional Substrate)

The compound semiconductor layer 2 and the functional substrate 3 is then bonded together.

The compound semiconductor layer 2 is bonded to the functional substrate 3 such that the surface of the current diffusion layer 8 composing the compound semiconductor layer 2 is initially polished to obtain a mirror surface. Then, the functional substrate 3 to be attached to the surface that is polished to be the mirror surface of the current diffusion layer 8 is prepared. The surface of the functional substrate 3 is polished to be the mirror surface before it is bonded to the current diffusion layer 8. Subsequently, the compound semiconductor layer 2 and the functional substrate 3 are carried into a general-use semiconductor material attachment device and an Ar beam neutralized by electron impact is irradiated onto the surfaces of the compound semiconductor layer 2 and the functional substrate 3, the surfaces having been polished into mirror surfaces in vacuo. The both surfaces of the compound semiconductor layer 2 and the functional substrate 3 are superimposed to each other within the attachment device kept in vacuo to be applied with a load, resulting in achieving bonding thereof at room temperature (see, FIG. 11). In bonding the surfaces, it is more desirable that the surfaces to be bonded together are made of the same material in view of stability of the bonding conditions.

The bonding at room temperature in vacuo is the most optimum method for bonding (i.e., attachment). However, the bonding also can be achieved by using the eutectic metal or an adhesive.

(Process for Forming First Electrode and Second Electrode)

The n-type Ohmic electrode 4 as the first electrode and the p-type Ohmic electrode 5 as the second electrode are then formed.

Initially, in forming the n-type Ohmic electrode 4 and the p-type Ohmic electrode 5, the GaAs substrate 14 and the buffer layer 15 are selectively removed from the compound semiconductor layer 2 after bonded with the functional substrate 3 by using an ammonia series etchant. Then, the n-type Ohmic electrode 4 is formed on an exposed surface of the contact layer 16. Specifically, for example, the n-type Ohmic electrode 4 is formed such that, after AuGe and Ni alloy/Pt/Au are laminated so as to be a predetermined thickness by a vacuum evaporation method, patterning is performed by using a general-use photolithography means.

Then, a predetermined area of each of the contact layer 16, the upper cladding layer 13, the upper guide layer 12, the active layer 11, the lower guide layer 10, and the p-type lower cladding layer 9 is selectively removed to expose the current diffusion layer 8. The P-type Ohmic electrode 5 is formed on thus exposed surface of the current diffusion layer 8. Specifically, for example, after AuBe/Au is laminated so as to be a predetermined thickness by the vacuum evaporation method, the patterning is performed by using a general-use photolithography means to shape the p-type Ohmic electrode 5. Then, thus formed p-type Ohmic electrode 5 is subjected to the thermal process, for example, under conditions at a temperature in a range from 400° C. to 500° C. for 5 to 20 minutes for alloying. Accordingly, the n-type Ohmic electrode 4 and the p-type Ohmic electrode 5 having a low resistance can be formed.

(Process for Forming Third Electrode)

The third electrode is formed on a rear surface of the functional substrate. According to a structure of element, functions of the Ohmic electrode, a Schottky electrode, a reflex function, and a eutectic die bonding structure can be combined to be added to the third electrode.

The transparent substrate is made of a material such as Au, Ag, and Al and is configured to a structure that reflects light. For example, a transparent film made of oxidized silicon and ITO can be inserted inbetween the substrate and the above described materials. The transparent substrate can be formed by the publicly known technique such as the sputtering and the evaporation method.

When a front surface side of the electrode is made of the eutectic metal such as AuSn and a lead-free solder material, the paste is no longer required to be used in the die bond process. As a result thereof, the forming process can be simplified. In the forming method, the publicly known technique such as the sputtering, the evaporation method, the plating, and the printing can be used.

Connection via metal achieves better thermal conduction of the light-emitting diode, resulting in improving the discharge characteristics of the light-emitting diode.

In case where the above described two functions are combined, it is also suitable to insert a barrier metal and oxide so as to avoid diffusion of the metal during the forming process. The optimum functions can be selected according to the device structure and the material of the substrate.

(Processing Process of Functional Substrate)

The shape of the functional substrate 3 is then processed.

In processing the functional substrate 3, a V-shaped groove is initially formed on a surface on which the third electrode 6 is not formed. At the time, an inner side surface of a side of the third electrode 6 of the V-shaped groove becomes the inclined surface 3b having the angle α between the inner side surface and the surface in parallel with the light emitting face. Then, the dicing is performed at predetermined intervals from the side of the compound semiconductor layer 2 to form chips. The vertical surfaces 3a of the functional substrate 3 are formed by the dicing for forming chips.

The method for forming the inclined surface 3b is not limited to any method but can be a combination of the conventional methods such as the wet etching, the dry etching, the scribing process, and the laser processing. Among them, it is most preferable to apply the dicing that can provide satisfactory controllability of the shape and productivity. Application of the dicing enhances production yield.

The method for forming the vertical surface 3a is not limited to any method but may preferably be the laser processing, the scribe break method, or the dicing.

Manufacturing costs can be decreased by employing the laser processing and the scribe break method. In other words, a cutting margin is not required to be provided upon dividing into chips and thus more number of light-emitting diodes can be manufactured in the above method, so that manufacturing costs can be decreased.

On the other hand, the dicing is excellent in stability upon cutting.

Finally, broken layers and contamination are removed, as required, by etching using a sulfuric acid/hydrogen peroxide liquid mixture, and the like. Accordingly, the light-emitting diode 1 is manufactured.

As described above, the light-emitting diode 1 of the present embodiment includes the compound semiconductor layer 2 including the light emitting section 7. The light emitting section 7 includes the well layers 17 having the composition: $(In_{X1}Ga_{1-X1})As$ $(0 \leq X1 \leq 1)$.

In the light-emitting diode 1 of the present embodiment, the current diffusion layer 8 is provided on the light emitting section 7. The current diffusion layer 8 is transparent with respect to the emission wavelength, so that, with the current diffusion layer 8, the light-emitting diode 1 can be configured not to absorb the light emitted from the light emitting section 7. As a result, the light-emitting diode 1 can realize high output and high efficiency. The functional substrate is made of a material having stability and no corrosion risk, and is excellent in moisture resistance.

Therefore, according to the light-emitting diode 1 of the present embodiment, the light-emitting diode 1 having an emission wavelength of 850 nm or more, excellent in monochromaticity, with a high output and high efficiency, and having the moisture resistance can be provided. Further, according to the light-emitting diode 1 of the present embodiment, the high output light-emitting diode 1 having the luminous efficiency of about two times or more as that of a conventional transparent substrate type AlGaAs series light-emitting diode manufactured by the liquid phase epitaxial method can be provided. Still further, high temperature and high moisture reliability is also improved.

Light-Emitting Diode

Second Embodiment

Figure 12A:
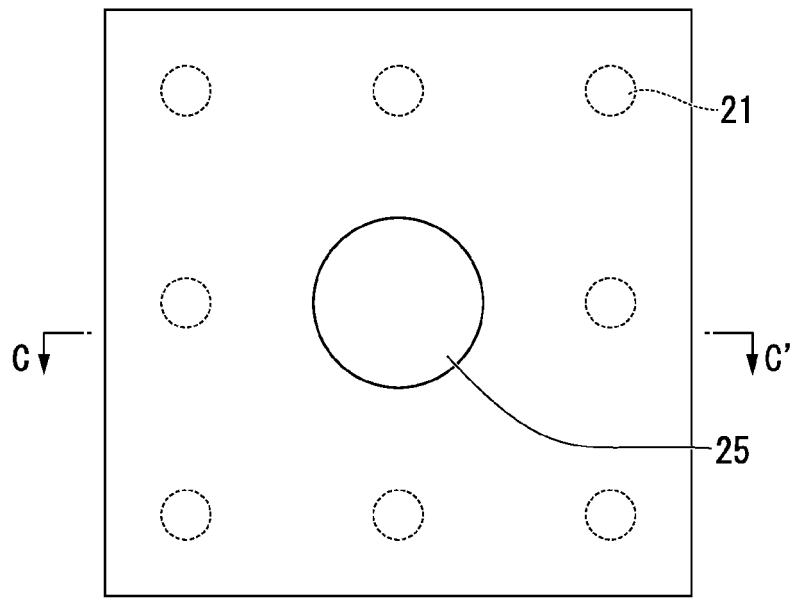
FIG. 12A is a plan view of the light-emitting diode according to the embodiment of the present invention.
Figure 12B:
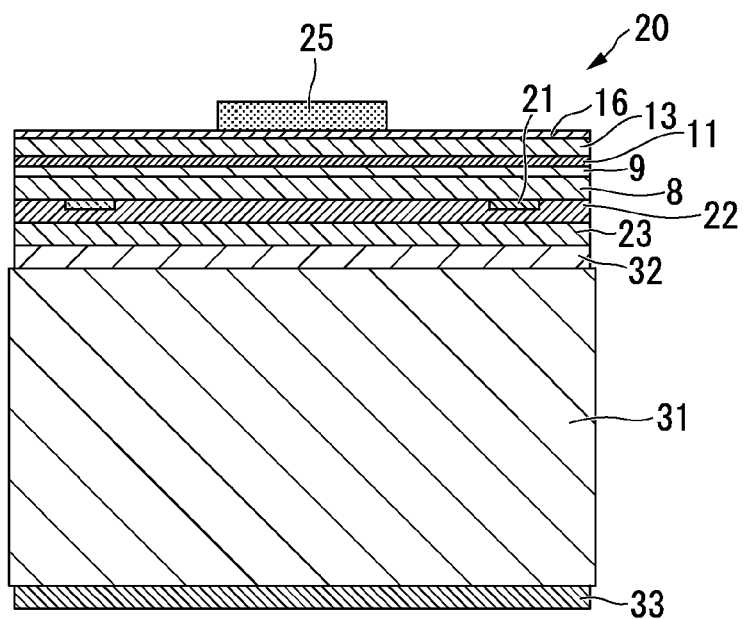
FIG. 12B is a schematic cross sectional view of FIG. 12A taken along lines C-C'.

FIGS. 12A and 12B illustrate a light-emitting diode according to a second embodiment to which the present invention is applied. FIG. 12A is a plane view of the light-emitting diode. FIG. 12B is a cross sectional view of the light-emitting diode of FIG. 12A taken along lines C-C', respectively.

The light-emitting diode according to the second embodiment includes the light emitting section 7 including the active layer 11 having the quantum well structure in which the well layers 17 having the composition: $(In_{X1}Ga_{1-X1})As$ $(0 \leq X2 \leq 1)$ and the barrier layers 18 having the composition: $(Al_{X2}Ga_{1-X2})As$ $(0 \leq X2 \leq 1)$ are alternately laminated, the first guide layer 10 and the second guide layer 12 which are paired to sandwich the active layer 11 and have the composition: $(Al_{X2}Ga_{1-X2})As$ $(0 \leq X3 \leq 1)$, the first cladding layer 9 and the second cladding layer 13 which are paired to sandwich the active layer 11 via the first guide layer 10 and the second guide layer 12, respectively, the current diffusion layer 8 formed on the light emitting section 7, and the functional substrate 31 that includes the reflective layer 23 and is bonded to the current diffusion layer 8, the reflecting layer 23 being disposed facing to the light emitting section 7 and having a reflectance of 90% or more with respect to the emission wavelength, wherein the first cladding layer 9 and the second cladding layer 13 have the composition: $(Al_{X4}Ga_{1-X4})_Y In_{1-Y}P$ $(0 \leq X4 \leq 1, 0 < Y \leq 1)$.

Since the light-emitting diode according to the second embodiment includes the functional substrate 31 including the reflective layer 23 that has the reflectance of 90% or more with respect to the emission wavelength and is disposed facing to the light emitting section 7, the efficient light extraction can be achieved via the main light extracting surface.

In the examples illustrated in FIGS. 12A and 12B, the functional substrate 31 is provided with the second electrode 21 on the lower surface 8b of the current diffusion layer 8 and further provided with a reflective structure in which a transparent conductive film 22 and the reflective layer 23 are laminated so as to cover the second electrode 21 and a layer (i.e., substrate) 30 made of silicon or germanium.

In the light-emitting diode according to the second embodiment, the functional substrate 31 preferably includes a layer made of silicon or germanium. This is because the moisture resistance of the functional substrate 31 improves owing to corrosion-inhibiting characteristics of the silicon and the germanium.

The reflective layer 23 is made of, for example, silver (Ag), aluminum (Al), gold (Au), an alloy thereof, and the like. The above materials have a high light reflectance and thus can reflect light from the reflective layer 23 for 90% or more.

In the functional substrate 31, the reflective layer 23 can be combined, via bonding, with the economical substrate (i.e., layer) made of for example, silicon and germanium via the eutectic metal such as AuIn, AuGe, and AuSn. Especially, the AuIn has a low bonding temperature and a gap in the heat expansion coefficient in comparison with that of the light emitting section; however, is the most optimum material to be combined with the most economical silicon substrate (i.e., silicon layer) via bonding.

It is desirable that the functional substrate 31 is configured such that, for example, a layer made of a refractory metal such as titanium (Ti), tungsten (W), platinum (Pt), and the like is inserted into the functional substrate 31 in order to avoid counter diffusion of the current diffusion layer, the reflective layer metal, and the eutectic metal in view of stability of quality.

Light-Emitting Diode

Third Embodiment

Figure 13:
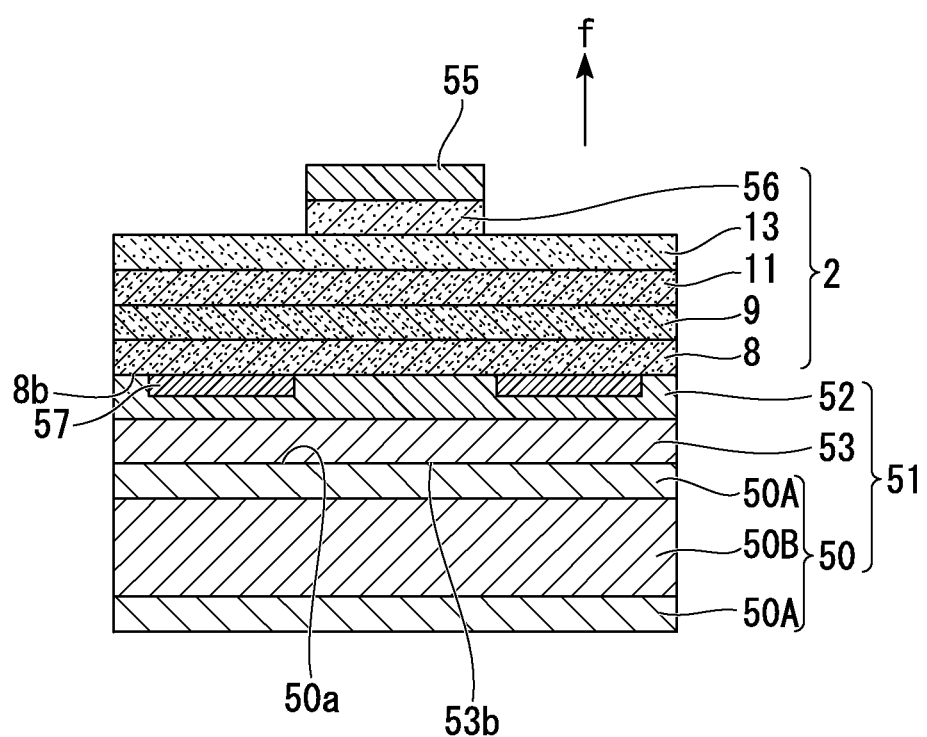
FIG. 13 is a schematic cross sectional view of the light-emitting diode according to another embodiment of the present invention.

FIG. 13 illustrates a light-emitting diode according to a third embodiment to which the present invention is applied.

The light-emitting diode according to the third embodiment includes the light emitting section 7 including the active layer 11 having the quantum well structure in which the well layers 17 having the composition: $(In_{X1}Ga_{1-X1})As$ ($0 \leq X1 \leq 1$) and the barrier layers 18 having the composition: $(Al_{X2}Ga_{1-X2})As$ ($0 \leq X2 \leq 1$) are alternately laminated, the first guide layer 10 and the second guide layer 12 which are paired to sandwich the active layer 11 and have the composition: $(Al_{X3}Ga_{1-X3})As$ ($0 \leq X3 \leq 1$), and the first cladding layer 9 and the second cladding layer 13 which are paired to sandwich the active layer 11 via the first guide layer 10 and the second guide layer 12, respectively, the current diffusion layer 8 formed on the light emitting section 7, and the functional substrate 51 including the reflective layer 53 and the metal substrate 50 which are deposited facing to the light emitting section 7 and have a reflectance of 90% or more with respect to the emission wavelength to be bonded to the current diffusion layer 8, wherein the first cladding layer 9 and the second cladding layer 13 have the composition: $(Al_{X4}Ga_{1-X4})_Y In_{1-Y}P$ ($0 \leq X4 \leq 1$, $0 < Y \leq 1$).

The light-emitting diode according to the third embodiment has a specific configuration in comparison with the light-emitting diode according to the second embodiment in that the functional substrate includes the metal substrate.

The metal substrate 50 has high heat dissipation and contributes to cause the light-emitting diode to emit light at high intensity as well as can assist a longer lasting life of the light-emitting diode.

In view of the heat dissipation, the metal substrate 50 is preferably made of a metal having a thermal conduction ratio of 130 W/m·K or more. Examples of the metal having a thermal conduction ratio of 130 W/m·K or more include molybdenum (138 W/m·K), tungsten (174 W/m·K), silver (thermal conduction ratio equal to 420 W/m·K), copper (thermal conduction ratio equal to 398 W/m·K), gold (thermal conduction ratio equal to 320 W/m·K), and aluminum (thermal conduction ratio equal to 236 W/m·K).

As illustrated in FIG. 13, the compound semiconductor layer 2 includes the active layer 11, the first cladding layer (i.e., lower clad) 9 and the second cladding layer (i.e., upper clad) 13 which are paired to sandwich the active layer 11 via the guide layers (not illustrated), the current diffusion layer 8 provided below the first cladding layer (i.e., lower clad) 9, and the contact layer 56 on the second cladding layer (i.e., upper clad) 13, the contact layer 56 having a size approximately identical to that of the first electrode 55 viewed on a plane.

A functional substrate 51 includes second electrodes 57 on an under side surface 8b of the current diffusion layer 8, a reflective structure in which the transparent conductive film 52 and the reflective layer 53 are laminated so as to cover the second electrodes 57, and a metal substrate 50, wherein a bonding surface 50a of the metal substrate 50 is bonded to a surface 53b opposing to the compound semiconductor layer 2 of the reflective layer 53 that composes the reflective structure.

The reflective layer 53 is made of, for example, a metal such as copper, silver, gold, aluminum, or an alloy thereof. These materials have a high light reflectance and can reflect light emitted from the reflective structure at a reflectance of 90% or more. With the formation of the reflective layer 53, light from the active layer 11 is reflected in a front direction f by the reflective layer 53 to improve the light extracting efficiency in the front direction f. Accordingly, the light intensity of the light-emitting diode can be further improved.

Preferably, the reflective layer 53 has a laminated structure in which Ag, Ni/Ti barrier layer, Au-series eutectic metal (i.e., connection metal) are laminated from a side of a transparent conductive film 52.

The connection metal has a low electrical resistance and melts at low temperature. With the use of the connection metal, the metal substrate can be connected without applying a thermal stress to the compound semiconductor layer 2.

Examples of the connection metal include an Au-series eutectic metal that is chemically stable and has a low melting point. Examples of the Au-series eutectic metal include a eutectic composition (i.e., Au-series eutectic metal) of alloys of AuSn, AuGe, AuSi, and the like.

Preferably, a metal such as titanium, chrome, and tungsten are added to the connection metal. Accordingly, the metal such as the titanium, the chrome, and the tungsten functions as a barrier metal to be able to inhibit impurities contained in the metal substrate from being diffused to a side of the reflective layer 53 to induce reaction.

The transparent conductive film 52 is made of an ITO film, an IZO film, and the like. The reflective structure may be composed only of the reflective layer 53.

Instead of the transparent conductive film 52 or together with the transparent conductive film 52, a so-called cold mirror such as a titanium oxide film, a multilayered film of an oxidized silicon and white alumina, and AlN may be combined with the reflective layer 53. The cold mirror utilizes a reflective index difference of the transparent material.

The metal substrate 50 may be formed of a plurality of metal layers.

Preferable configuration composed of the plurality of metal layers is illustrated in FIG. 13. That is, two types of metal layers, i.e., first metal layer 50A and second metal layer 50B, are alternately laminated.

Particularly, the total number of the first metal layers 50A and the second metal layers 50B is more preferably odd number.

In this case, when a material having the heat expansion coefficient smaller than that of the compound semiconductor layer 2 is used as the second metal layer 50B, the first metal layers 50A and 50A are made of a material having the heat expansion coefficient larger than that of the compound semiconductor layer 3. Accordingly, a value of the heat expansion coefficient of the entire metal substrate comes to proximal to a value of the heat expansion coefficient of the compound semiconductor layer. As a result thereof, warping and breakage of the metal substrate caused upon bonding the compound semiconductor layer with the metal substrate can be controlled and a production yield of the light-emitting diode can be improved. Similarly, when a material having the heat expansion coefficient larger than that of the compound semiconductor layer 2 is used as the second metal layer 50B, the first metal layers 50A and 50A are made of a material having a value of the heat expansion coefficient smaller than a value of the heat expansion coefficient of the compound semiconductor layer 2. Therefore, warping and breakage of the metal substrate upon bonding the compound semiconductor layer with the metal substrate can be controlled, and thus the production yield of the light-emitting diode can be improved.

Examples of the two types of metal layers may be a combination of a metal layer made of, for example, either one of silver (having a heat expansion coefficient equal to 18.9 ppm/K), copper (having a heat expansion coefficient equal to 16.5 ppm/K), gold (having a heat expansion coefficient equal to 14.2 ppm/K), aluminum (having a heat expansion coefficient equal to 23.1 ppm/K), nickel (having a heat expansion coefficient equal to 13.4 ppm/K), and alloys thereof with a metal layer made of either one of molybdenum (having a heat expansion coefficient equal to 5.1 ppm/K), tungsten (having a heat expansion coefficient equal to 4.3 ppm/K), chrome (having a heat expansion coefficient equal to 4.9 ppm/K), and alloys thereof.

EXAMPLES

The effects of the present invention will be described below in detail by way of Examples. The present invention is not limited to these Examples.

In the present Example, manufacturing of the light-emitting diode according to the present invention will be specifically described below. The light-emitting diode manufactured in the present Example is an infrared-emitting diode including an active layer having a quantum well structure composed of well layers made of InGaAs and barrier layers made of AlGaAs. In the present Example, the compound semiconductor layer and the functional substrate grown on the GaAs substrate are coupled to manufacture the light-emitting diode. Then, for the purpose of evaluating the characteristics thereof, a light-emitting diode lamp mounted with a light-emitting diode chip on the substrate is manufactured.

Example 1

Example 1 corresponds to the embodiment illustrated in FIG. 4.

In a light-emitting diode of Example 1, an epitaxial wafer is manufactured such that compound semiconductor layers are successively laminated on a GaAs substrate made of the Si-doped n-type GaAs single crystal.

In the GaAs substrate, a surface inclined from (100) surface by 15° in a (0-1-1) direction is the growing surface where the carrier concentration is $2\times10^{18}$ cm$^{-3}$. A film thickness of the GaAs substrate is about 0.5 μm. Examples of the compound semiconductor layer include an n-type buffer layer made of Si-doped GaAs, an n-type contact layer made of Si-doped $(Al_{0.7}Ga_{0.3})_{0.5}In_{0.5}P$, an n-type upper cladding layer made of Si-doped $(Al_{0.7}Ga_{0.3})_{0.5}In_{0.5}P$, an upper guide layer made of $Al_{0.4}Ga_{0.6}As$, a well layer/barrier layer made of 3 pairs of $(In_{0.2}Ga_{0.8})As/(Al_{0.15}Ga_{0.85})As$, a lower guide layer made of $Al_{0.4}Ga_{0.6}As$, a p-type lower cladding layer made of Mg-doped $(Al_{0.7}Ga_{0.3})_{0.5}In_{0.5}P$, a thin interlayer made of $(Al_{0.5}Ga_{0.5})_{0.5}In_{0.5}P$, and a current diffusion layer made of Mg-doped p-type GaP.

In the present Example, the compound semiconductor layer is epitaxially grown on the GaAs substrate having a diameter of 76 mm and a thickness of 350 μm by using the decompression metal-organic chemical vapor deposition device method (MOCVD device), thereby forming the epitaxial wafer. Upon growing the epitaxial growth layer, trimethyl aluminum $((CH_3)_3Al)$, trimethyl gallium $((CH_3)_3Ga)$, and trimethylindium $((CH_3)_3In)$ are used as materials of the group III composing elements. Biscyclopentadienyl magnesium $(bis-(C_5H_5)_2Mg)$ is used as an Mg doping material. Disilane $(Si_2H_6)$ is used as a Si doping material. Phosphine $(PH_3)$ and arsine $(AsH_3)$ are used as materials of the group V composing elements. The current diffusion layer made of p-type GaP is grown at a temperature of 750° C. Layers other than the current diffusion layer are grown at a temperature of 700° C.

The buffer layer made of GaAs has a carrier concentration of about $2\times10^{18}$ cm$^{-3}$ and a film thickness of about 0.5 μm. The contact layer has a carrier concentration of about $2\times10^{18}$ cm$^{-3}$ and a film thickness of about 50 nm. The upper cladding layer has a carrier concentration of about $1\times10^{18}$ cm$^{-3}$ and a film thickness of about 0.5 μm. The upper guide layer is undoped and has a film thickness of about 50 nm. The well layer is an undoped $(In_{0.2}Ga_{0.8})As$ and has a film thickness of about 5 nm. The barrier layer is an undoped $(Al_{0.15}Ga_{0.85})As$ and has a film thickness of about 10 nm. Three pairs of the well layers and the barrier layers are alternately laminated. The lower guide layer is undoped and has a film thickness of about 50 nm. The lower cladding layer has a carrier concentration of about $8\times10^{17}$ cm$^{-3}$ and a film thickness of about 0.5 μm. The interlayer has a carrier concentration of about $8\times10^{17}$ cm$^{-3}$ and a film thickness of about 50 nm. The current diffusion layer made of GaP has a carrier concentration of about $3\times10^{18}$ cm$^{-3}$ and a film thickness of about 10 μm.

Subsequently, the current diffusion layer is subjected to polishing up to an area of a depth of about 1 μm from a surface of the current diffusion layer to provide mirror-like finishing.

With the mirror-like finishing, a surface roughness (rms) of the current diffusion layer becomes 0.18 nm.

On the other hand, an n-type GaP functional substrate to be attached to the surface of the current diffusion layer after being mirror polished is prepared. In the functional substrate to be attached to the current diffusion layer, a single crystal with the plane direction (111) after Si is added such that the carrier concentration becomes about $2\times10^{17}$ cm$^{-3}$ is used. The functional substrate has a diameter of 76 mm and a thickness of 250 μm. A surface of the functional substrate is polished to be a mirror surface before it is bonded to the current diffusion layer. A surface roughness (rms) of the surface of the functional substrate is polished to 0.12 nm.

Then, the functional substrate and the epitaxial wafer are carried into a general-use semiconductor material attachment device, of which inside is evacuated up to $3\times10^{-5}$ Pa.

The surfaces of both of the functional substrate and the current diffusion layer are irradiated with an Ar beam that is neutralized by electron collision for 3 minutes. Subsequently, within the attachment device in vacuo, the surfaces of the functional substrate and the current diffusion layer are superimposed to each other and applied with a load until the pressure of each surface becomes 50 g/cm². Accordingly, the functional substrate and the current diffusion layer are bonded together at a room temperature to form a bonded wafer.

The GaAs substrate and the GaAs buffer layer are selectively removed from the bonded wafer by using the ammonia series etchant. Subsequently, as the first electrode, an AuGe/Ni alloy, Pt, and Au are formed on the surface of the contact layer such that thicknesses thereof become 0.5 μm, 0.2 μm, and 1 μm, respectively, by the vacuum evaporation method. Then, by using a general-use photolithography means, patterning is provided thereto to form the n-type Ohmic electrode as the first electrode. The surface of the light extracting surface, i.e., the surface from which the GaAs substrate is removed, is roughened.

Then, an epitaxial layer is selectively removed from an area where the p-type Ohmic electrode as the second electrode is formed to cause the current diffusion layer to be exposed. The p-type Ohmic electrode is formed on the surface of the exposed current diffusion layer by the vacuum evaporation method such that a thickness of AuBe becomes 0.2 μm and a thickness of Au becomes 1 μm. Subsequently, the thermal process is provided thereto at a temperature of 450° C. for 10 minutes to make an alloy, thereby forming the p-type Ohmic electrode and the n-type Ohmic electrode having a low resistance.

Then, by using a dicing saw, the area including no third electrode is provided with a V-shaped groove from a rear surface of the functional substrate such that an angle α of the inclined surface becomes 70° as well as a thickness of the vertical surface becomes 80 μm. The light-emitting diode is cut at intervals of 350 μm from the compound semiconductor layer side by using the dicing saw to form chips. The broken layers and the contamination generated by the dicing are etched to be removed by using a sulfuric acid/hydrogen peroxide liquid mixture, thereby manufacturing the light-emitting diode of Example 1.

The light-emitting diode chips of Example 1 manufactured as described above are mounted on the mount substrates to assemble 100 light-emitting diode lamps. Each light-emitting diode lamp is manufactured such that the mounted substrate is supported (mounted) by die bonders, the n-type Ohmic electrode of the light-emitting diode and the n-type electrode terminal provided on the surface of the mount substrate are wire-bonded by using a gold wire, and, after the p-type Ohmic electrode and a p-type electrode terminal are wire-bonded by using the gold wire, the light-emitting diode lamp is formed by being sealed with a general-use epoxy resin.

The evaluation results of the characteristics of the light-emitting diode (i.e., light-emitting diode lamp) are shown in Table 5.

As shown in Table 5, when applying electrical current across the n-type Ohmic electrode and the p-type Ohmic electrode, the infrared light having a peak wavelength of 920 nm is emitted. A forward voltage ($V_F$) upon application of current of 20 milliampere (mA) in a forward direction becomes about 1.2 volt by reflecting a low resistance at a bonded interface between the current diffusion layer and the functional substrate composing the compound semiconductor layer and satisfactory Ohmic characteristics of each Ohmic electrode. The emission output upon application of current of 20 mA in the forward direction was 7.0 mW.

100 lamps are subjected to a current test under high temperature and humidity at a temperature of 60° C., humidity of 90 RH %, and current application of 20 mA. An average of output survival rate alter 1,000 hours was 99%.

TABLE 5

|  | Material of substrate | Emission wavelength (nm) | Emission output (mW) | Forward voltage (V) | Reliability PO: % |
| --- | --- | --- | --- | --- | --- |
| Example 1 | GaP | 920 | 7.0 | 1.2 | 99% |
| Example 2 | Si | 920 | 6.0 | 1.2 | 98% |
| Example 3 | Cu/Mo/Cu | 920 | 5.9 | 1.2 | 99% |
| Example 4 | GaP | 870 | 6.8 | 1.3 | 100% |
| Example 5 | Si | 870 | 6.1 | 1.3 | 99% |
| Example 6 | GaP | 960 | 6.5 | 1.18 | 99% |
| Example 7 | Si | 960 | 5.3 | 1.18 | 98% |
| Example 8 | GaP | 985 | 5 | 1.16 | 97% |
| Example 9 | Si | 985 | 3.8 | 1.15 | 96% |
| Comparative Example | AlGaAs | 920 | 2 | 1.2 | 86% |

Measured current = 20 mA
Reliability (%): energized by 20 mA under conditions of 60° C. and 90RH %, survival rate after 1,000 hours Example 2

Example 2 corresponds to the embodiment illustrated in FIGS. 12A and 12B.

In a light-emitting diode of Example 2, the reflective layer and the functional substrate are combined. Formation of the other light emitting section is identical to that of Example 1. Illustration of the lower guide layer 10 and the upper guide layer 12 is omitted here.

Eight electrodes (i.e., second electrodes) 21 made of the AuBe/Au alloy of a thickness of 0.2 nm in the form of 20 μmφ dots are arranged on a surface of the current diffusion layer 8 at regular intervals such that each interval becomes 50 μm from an end of the light extracting surface.

The ITO film 22 as the transparent conductive film is sputtered with a thickness of 0.4 μm. A layer 23 made of silver alloy/Ti/Au is formed so as to have a thickness of 0.2 μm/0.1 μm/1 μm to form a reflective surface 23.

On the other hand, a layer 32 made of Ti/Au/In is formed on the surface of the silicon substrate (i.e., functional substrate) 31 with a thickness of 0.1 μm/0.5 μm/0.3 μm. A layer 33 made of Ti/Au is formed on a rear surface of the silicon substrate 31 with a thickness of 0.1 μm/0.5 μm. A surface of Au of a side of the light-emitting diode wafer and a surface of In of a side of the silicon substrate are superimposed to each other to be heated at a temperature of 320° C. and applied with a pressure of 500 g/cm². Accordingly, the functional substrate is bonded to the light-emitting diode wafer.

After removing the GaAs substrate, the Ohmic electrode (i.e., first electrode) 25 made of AuGe/Au is formed on the surface of the contact layer 16 with a diameter of 100 μm and a thickness of 3 μm. Then, the resulting Ohmic electrode 25 is subjected to the thermal process for 5 minutes at a temperature of 420° C., thereby subjecting the p-type Ohmic electrode and the n-type Ohmic electrode to an alloying process.

Then, the surface of the contact layer 16 is roughened.

The semiconductor layer, the reflective layer, and the eutectic metal of the areas to be cut for dividing the silicon substrate into chips are removed. The silicon substrate is cut into square shaped chips by using the dicing saw at a pitch of 350 μm.

The evaluation results of the characteristics of the light-emitting diode (i.e., light-emitting diode lamp) are shown in Table 5.

As shown in Table 5, upon passing current across the electrodes of the upper surface and the lower surface, the infrared light having the peak wavelength of 920 nm is emitted. The forward voltage ($V_F$) upon passing the current of 20 milliampere (mA) in the forward direction becomes about 1.2 volt (V) reflecting the low resistance at a bonding interface between the current diffusion layer composing the compound semiconductor layer and the functional substrate and satisfactory Ohmic characteristics of each Ohmic electrode. An emission output upon passing the current of 20 mA in the forward direction was about 6.0 mW.

In the same manner as in Example 1, 100 lamps are subjected to the current test under high temperature and humidity at a temperature of 60° C., the humidity of 90 RH %, and the passing current amount of 20 mA. An average of the output survival rate after 1,000 hours was 98%.

Example 3

A light-emitting diode of Example 3 corresponds to the third embodiment and thus has a configuration in which the current diffusion layer is bonded with the functional substrate including the reflective layer and the metal substrate. With reference to FIG. 13, the light-emitting diode of Example 3 is described below.

Initially, a metal substrate is manufactured. 2 pieces of approximately flat-shaped Cu plates having a thickness of 10 μm and a single piece of approximately flat Mo plate having a thickness of 75 μm are prepared and the Mo plate is inserted inbetween the 2 pieces of Cu plates with the plates layered one another. The resulting substrate is disposed within a pressure device to apply a load to the metal plates at a high temperature in a direction to sandwich the resulting substrate. Accordingly, the metal substrate including 3 layers made of Cu(10 μm)/Mo(75 μm)/Cu(10 μm) is manufactured.

The compound semiconductor layer is formed under the conditions identical to that of Example 1 except that an etching stop layer made of Si-doped $(Al_{0.5}Ga_{0.5})_{0.5}In_{0.5}P$ and having a film thickness of 0.5 μm is formed between the buffer layer and the contact layer.

A second electrode 57 is formed such that an AuBe layer having a thickness of 0.4 μm and a Au layer having a thickness of 0.2 μm are laminated in this order on the surface 8b of the current diffusion layer 8. The second electrodes 57 have a circular shape of 20 μmϕ in planer view and are formed at pitches of 60 μm.

An ITO film 52 as the transparent conductive film is formed with a thickness of 0.8 μm by sputtering deposition so as to cover the second electrodes 57.

A film made of a silver (Ag) alloy with a thickness of 0.7 μm, and subsequently a film made of nickel (Ni)/titanium (Ti) with a thickness of 0.5 μm and a film made of gold (Au) with a thickness of 1 μm are formed on the ITO film 52 by using the vapor deposition method, thereby forming a reflective film 53.

A structure made of the ITO film 52 and the reflective film 53 and the metal substrate are faced to be layered on the current diffusion layer 8 of the compound semiconductor layer and carried into the decomposition device. In the decomposition device, thus laminated layers are bonded by being applied with a load of 500 kg while heating at a temperature of 400° C. As a result thereof, a bonding structure thereof is formed.

Then, the GaAs substrate and the buffer layer as the growth substrate of the compound semiconductor layer are selectively removed from the bonding structure by using the ammonia series etchant and further an etching stop layer is selectively removed by using hydrochloric acid-based etchant.

Subsequently, by using the vacuum evaporation method, AuGe film is formed with a thickness of 15 μm, Ni film is formed with a thickness of 0.05 μm, and Au film is further formed with a thickness of 1 μm in this order on the contact layer, thereby forming a conducting film for the first electrode. A conducting film for electrode is patterned into a circular shape in planer view by using a photolithography means to manufacture a first electrode 55 having a diameter of 100 μm and a thickness of 3 μm.

A contact layer 56 is formed by removing a portion of the contact layer other than a portion below the first electrode as a mask by using the ammonia series etchant by the etching method.

The compound semiconductor layer, the reflective layer, and the eutectic metal of the portion to be cut for dividing into chips are removed and the metal substrate is cut into square shapes at pitches of 350 μm by the laser dicing.

The evaluation results of the characteristics of the light-emitting diode (i.e., light-emitting diode lamp) are shown in Table 5.

As shown in Table 5, when the current passes across the n-type Ohmic electrode and the p-type Ohmic electrode, the infrared light having a peak wavelength of 920 nm is emitted. The forward voltage ($V_F$) upon passing the current of 20 milliampere (mA) in the forward direction becomes about 1.2 volt reflecting the low resistance at the bonded interface between the current diffusion layer composing the compound semiconductor layer and the functional substrate and satisfactory Ohmic characteristics of each Ohmic electrode. The emission output upon passing the current of 20 mA in the forward direction was 5.9 mW.

Twenty lamps are subjected to the current test under high temperature and humidity at a temperature of 60° C., humidity of 90 RH %, and the current amount of 20 mA.

An average of the output survival rate after 1,000 hours was 99%.

Example 4

A light-emitting diode of an Example 4 corresponds to the first embodiment and is manufactured under conditions identical to those of Example 1 except that the In composition X1 of the well layer is equal to 0.12 in order to cause the emission peak wavelength to be 870 nm.

The evaluation results of the characteristics of the light-emitting diode (i.e., light-emitting diode lamp) are shown in Table 7. That is, the infrared light having a peak wavelength of 870 nm is emitted and averages of the emission output ($P_0$), the forward voltage ($V_F$), and an output survival rate were 6.8 mW, 1.3 V, and 100%, respectively.

Example 5

A light-emitting diode of Example 5 corresponds to that of the second embodiment and is manufactured in conditions identical to those of Example 2 except that the In composition X1 of the well layer is equal to 0.12 in order to cause the emission peak wavelength to be 870 nm.

The evaluation results of the characteristics of the light-emitting diode (i.e., light-emitting diode lamp) are shown in Table 7. That is, the infrared light having a peak wavelength of 870 nm is emitted and averages of the emission output ($P_0$), the forward voltage ($V_F$), and the output survival rate were 6.1 mW, 1.3 V, and 100%, respectively.

Example 6

A light-emitting diode of Example 6 corresponds to that of the first embodiment and is manufactured under conditions identical to those of Example 1 except that the In composition X1 of the well layer is equal to 0.25 in order to cause the emission peak wavelength to be 960 nm.

The evaluation results of the characteristics of the light-emitting diode (i.e., light-emitting diode lamp) are shown in Table 7. That is, the infrared light having a peak wavelength of 960 nm is emitted and averages of the emission output ($P_0$), the forward voltage ($V_F$), and the output survival rate were 6.5 mW, 1.18 V, and 99%, respectively.

Example 7

A light-emitting diode of Example 7 corresponds to that of the second embodiment and is manufactured under conditions identical to those of Example 2 except that the In composition X1 of the well layer is equal to 0.25 (X1=0.25) in order to cause the emission peak wavelength to be 960 nm.

The evaluation results of the characteristics of the light-emitting diode (i.e., light-emitting diode lamp) are shown in Table 7. That is, the infrared light having the peak wavelength of 960 nm is emitted and averages of the emission output ($P_0$), the forward voltage ($V_F$), and the output survival rate were 5.3 mW, 1.18V, and 98%, respectively.

Example 8

A light-emitting diode of Example 8 corresponds to that of the first embodiment and is manufactured under conditions identical to those of Example 1 except that the In composition X1 of the well layer is equal to 0.3 (X1=0.3) in order to cause the emission peak wavelength to be 985 nm.

The evaluation results of the characteristics of the light-emitting diode (i.e., light-emitting diode lamp) are shown in Table 7. That is, the infrared light having a peak wavelength of 985 nm is emitted and averages of the emission output ($P_O$), forward voltage ($V_F$), and the output survival rate were 5.0 mW, 1.16 V, and 97%, respectively.

Example 9

A light-emitting diode of Example 9 corresponds to that of the second embodiment and is manufactured under conditions identical to those of Example 2 except that the In composition X1 of the well layer is equal to 0.3 (X1=0.3) in order to cause the emission peak wavelength to be 985 nm.

The evaluation results of the characteristics of the light-emitting diode (i.e., light-emitting diode lamp) are shown in Table 7. That is, the infrared light having a peak wavelength of 985 nm is emitted and averages of the emission output ($P_O$), the forward voltage ($V_F$), and the output survival rate were 3.8 mW, 1.15 V, and 96%, respectively.

Comparative Example 1

A light-emitting diode of Comparative Example 1 is formed by the liquid phase epitaxial method of a conventional technique. The light-emitting diode is changed to have such a configuration that the GaAs substrate includes a light emitting section having a double hetero structure in which $Al_{0.01}Ga_{0.99}As$ is formed into a light emitting layer.

The light-emitting diode of Comparative Example 1 is manufactured such that the GaAs single crystal substrate of an n-type (100) surface is formed with an n-type upper cladding layer made of $Al_{0.01}Ga_{0.99}As$ having a thickness of 50 μM, a Si-doped light emitting layer made of $Al_{0.01}Ga_{0.99}As$ having a thickness of 20 μm, a p-type lower cladding layer made of $Al_{0.7}Ga_{0.3}As$ having a thickness of 20 μm, a p-type thick layer made of $Al_{0.25}Ga_{0.75}As$ that is transparent with respect to the emission wavelength and has a thickness of 60 μm by the liquid phase epitaxial method. After the epitaxial growth, the GaAs substrate is removed. Then, an n-type Ohmic electrode having a diameter of 100 μm is formed on a surface of the n-type AlGaAs upper cladding layer. A p-type Ohmic electrode having a diameter of 20 μm is formed on a rear surface of the p-type AlGaAs thick film layer at an interval of 80 μm. After cutting the substrate by using the dicing saw at an interval of 350 μm, broken layers are removed by etching, thereby manufacturing the light-emitting diode chips of Comparative Example 1.

The evaluation results of the characteristics of the light-emitting diode lamp mounted with the light-emitting diode of Comparative Example 1 are shown in 5.

As shown in Table 5, upon passing the current across the n-type Ohmic electrode and the p-type Ohmic electrode, the infrared light having the peak wavelength of 940 nm is emitted. The forward voltage ($V_F$) upon passing the current of 20 milliampere (mA) in the forward direction becomes about 1.2 volt (V). The emission output upon passing the forward current of 20 mA was 2 mW. An output was lower in comparison with that of the Example of the present invention with respect to any one of the samples of Comparative Example 1.

In the same manner as in the Example, 100 lamps are subjected to the current test under high temperature and humidity at a temperature of 60° C., humidity of 90 RH %, and with the current of 20 mA. An average of the output survival rate after 1,000 hours lowers by 14% in comparison with the output survival rate of a start of the test. The lowering rate was much larger in comparison with the Examples in which the rate was lowered by 1% or less.

INDUSTRIAL APPLICABILITY

The light-emitting diode of the present invention can be used for a light-emitting diode product that emits infrared light having the emission peak wavelength of 850 nm or more, particularly 900 nm or more, with a high output and high efficiency.

REFERENCE SIGNS LIST

1 Light-emitting diode
2 Compound semiconductor layer
3 Functional substrate
3a Vertical surface
3b Inclined surface
4 n-type Ohmic electrode (First electrode)
5 p-type Ohmic electrode (Second electrode)
6 Third electrode
7 Light emitting section
8 Current diffusion layer
9 Lower cladding layer (First cladding layer)
10 Lower guide layer
11 Active layer
12 Upper guide layer
13 Upper cladding layer (Second cladding layer)
14 GaAs substrate
15 Buffer layer
16 Contact layer
17 Well layer
18 Barrier layer
20 Light-emitting diode
21 Electrode
22 Transparent conductive film
23 Reflective surface
25 Bonding electrode
30 Silicon substrate
31 Functional substrate
α Angle between inclined surface and surface in parallel with light emitting face
50 Metal substrate
51 Functional substrate
52 Transparent conductive film
53 Reflective layer
55 First electrode
56 Contact layer
57 Second electrode

The invention claimed is:
1. A light-emitting diode, comprising:
a light emitting section including an active layer having a quantum well structure in which well layers having the composition: $(In_{X1}Ga_{1-X1})As$ and barrier layers having the composition: $(Al_{X2}Ga_{1-X2})As$ ($0<X2\leq1$) are alternately laminated, a first guide layer and a second guide layer which are paired to sandwich the active layer and have the composition: $(Al_{X3}Ga_{1-X3})As$ ($0\leq X3\leq1$), and a first cladding layer and a second cladding layer which are paired to sandwich the active layer via the first guide layer and the second guide layer, respectively;
a current diffusion layer formed on the light emitting section; and
a functional substrate bonded to the current diffusion layer;

wherein the first cladding layer and the second cladding layer have the composition: $(Al_{X4}Ga_{1-X4})_Y In_{1-Y}P$ (0<X4<1, 0<Y≤1), and an emission peak wavelength is 900 nm or more and 985 nm or less.

2. The light-emitting diode according to claim 1, wherein the functional substrate is transparent with respect to the emission wavelength.

3. The light-emitting diode according to claim 1, wherein the functional substrate is made of GaP or SiC.

4. The light-emitting diode according to claim 1, wherein side surfaces of the functional substrate have vertical surfaces which are approximately vertical to a main light extracting surface at a side proximal to the light emitting section and inclined surfaces inclined inwardly with respect to the main light extracting surface at a side distal to the light emitting section.

5. The light-emitting diode according to claim 4, wherein the inclined surfaces include roughened surfaces.

6. The light-emitting diode according to claim 1, wherein the current diffusion layer is made of GaP or GaInP.

7. The light-emitting diode according to claim 1, wherein the current diffusion layer has a thickness in a range from 0.5 μm to 20 μm.

8. The light-emitting diode according to claim 1, wherein a first electrode and a second electrode are provided on a side of the main light extracting surface of the light-emitting diode.

9. The light-emitting diode according to claim 8, wherein the first electrode and the second electrode are Ohmic electrodes.

10. The light-emitting diode according to claim 8, which further comprises a third electrode on a surface opposite to a side of the main light extracting surface of the functional substrate.

11. A light-emitting diode lamp, comprising:
the light-emitting diode according to claim 10;
wherein the first and the third electrodes or the second and the third electrodes are connected to each other at an approximately identical potential.

12. A light-emitting diode lamp, comprising the light-emitting diode according to claim 1.

13. A lighting device, comprising the light-emitting diode according to claim 1.

14. A light-emitting diode, comprising:
a light emitting section including an active layer having a quantum well structure in which well layers having the composition: $(In_{X1}Ga_{1-X1})As$ (0.1≤X1≤0.3) and barrier layers having the composition: $(Al_{X2}Ga_{1-X2})As$ (0≤X2≤1) are alternately laminated, a first guide layer and a second guide layer which are paired to sandwich the active layer and have the composition: $(Al_{X3}Ga_{1-X3})As$ (0≤X3≤1), and a first cladding layer and a second cladding layer which are paired to sandwich the active layer via the first guide layer and the second guide layer, respectively;

a current diffusion layer formed on the light emitting section; and a functional substrate bonded to the current diffusion layer, the functional substrate being disposed facing to the light emitting section and including a reflective layer having a reflectance of 90% or more with respect to an emission wavelength;

wherein the first cladding layer and the second cladding layer have the composition: $(Al_{X4}Ga_{1-X4})_{Y3}In_{1-Y3}P$ (0≤X4≤1, 0<Y3≤1), and an emission peak wavelength is 900 nm or more and 985 nm or less.

15. The light-emitting diode according to claim 14, wherein the functional substrate includes a layer made of silicon or germanium.

16. The light-emitting diode according to claim 14, wherein the functional substrate includes a metal substrate.

17. The light-emitting diode according to claim 16, wherein the metal substrate is composed of a plurality of metal layers.

\* \* \* \* \*